United States Patent
Matsui et al.

(10) Patent No.: US 9,559,263 B2
(45) Date of Patent: Jan. 31, 2017

(54) LIGHT-EMITTING ELEMENT, LIGHT-EMITTING ELEMENT UNIT, AND LIGHT-EMITTING ELEMENT PACKAGE

(71) Applicant: ROHM CO., LTD., Kyoto (JP)

(72) Inventors: Nobuaki Matsui, Kyoto (JP); Hirotaka Obuchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/856,599

(22) Filed: Sep. 17, 2015

(65) Prior Publication Data

US 2016/0005929 A1  Jan. 7, 2016

Related U.S. Application Data

(63) Continuation of application No. 13/976,900, filed as application No. PCT/JP2011/080278 on Dec. 27, 2011, now Pat. No. 9,166,111.

(30) Foreign Application Priority Data

Dec. 27, 2010 (JP) .................................. 2010-290551

(51) Int. Cl.
*H01L 33/40* (2010.01)
*H01L 33/38* (2010.01)
(Continued)

(52) U.S. Cl.
CPC ............ *H01L 33/405* (2013.01); *H01L 33/382* (2013.01); *H01L 33/42* (2013.01); *H01L 33/44* (2013.01)

(58) Field of Classification Search
CPC ...... H01L 33/405; H01L 33/382; H01L 33/42; H01L 33/44; H01L 33/387
See application file for complete search history.

(56) References Cited

U.S. PATENT DOCUMENTS 7,183,586 B2  2/2007  Ichihara et al.
7,646,036 B2  1/2010  Kozawa et al.
(Continued)

FOREIGN PATENT DOCUMENTS

JP    2005-093970 A    4/2005
JP    2005-322722 A    11/2005
(Continued)

*Primary Examiner* — Minh-Loan Tran
*Assistant Examiner* — Farid Khan
(74) *Attorney, Agent, or Firm* — Rabin & Berdo, P.C.

(57) ABSTRACT

In a light-emitting element 1, a light-emitting layer 4, a second conductivity type semiconductor layer 5, a transparent electrode layer 6, a reflecting electrode layer 7 and an insulating layer 8 are stacked in this order on a first conductivity type semiconductor layer 3, while a first electrode layer 10 and a second electrode layer 12 are stacked on the insulating layer 8 in an isolated state. The light-emitting element 1 includes a plurality of insulating tube layers 9, discretely arranged in plan view, passing through the reflecting electrode layer 7, the transparent electrode layer 6, the second conductivity type semiconductor layer 5 and the light-emitting layer 4 continuously from the insulating layer 8 and reaching the first conductivity type semiconductor layer 3, first contacts 11, continuous from the first electrode layer 10, connected to the first conductivity type semiconductor layer 3 through the insulating layer 8 and the insulating tube layers 9, and second contacts 13, continuous from the second electrode layer 12, passing through the insulating layer 8 to be connected to the reflecting electrode layer 7.

27 Claims, 16 Drawing Sheets

(51) Int. Cl.
*H01L 33/42* (2010.01)
*H01L 33/44* (2010.01)

(56) References Cited

U.S. PATENT DOCUMENTS

| | | | |
|---|---|---|---|
| 7,842,963 B2 | 11/2010 | Schiaffino et al. | |
| 7,981,708 B1 | 7/2011 | Lee et al. | |
| 8,247,823 B2 | 8/2012 | Yahata et al. | |
| 2005/0056855 A1* | 3/2005 | Lin | H01L 33/382 257/98 |
| 2005/0104080 A1 | 5/2005 | Ichihara et al. | |
| 2006/0208273 A1* | 9/2006 | Kang | H01L 33/08 257/103 |
| 2006/0273335 A1* | 12/2006 | Asahara | H01L 33/405 257/98 |
| 2008/0029761 A1* | 2/2008 | Peng | H01L 33/486 257/43 |
| 2008/0048176 A1 | 2/2008 | Orita et al. | |
| 2008/0096297 A1 | 4/2008 | Schiaffino et al. | |
| 2008/0185609 A1 | 8/2008 | Kozawa et al. | |
| 2009/0020776 A1* | 1/2009 | Lin | H01L 33/382 257/98 |
| 2009/0039359 A1* | 2/2009 | Yoon | H01L 33/382 257/88 |
| 2009/0085052 A1 | 4/2009 | Ko et al. | |
| 2009/0159902 A1* | 6/2009 | Yasuda | H01L 33/08 257/88 |
| 2010/0051987 A1 | 3/2010 | Katsuno et al. | |
| 2010/0163901 A1 | 7/2010 | Fudeta | |
| 2011/0003416 A1 | 1/2011 | Jang et al. | |
| 2011/0018022 A1 | 1/2011 | Okabe et al. | |
| 2011/0068359 A1* | 3/2011 | Yahata | H01L 33/382 257/98 |
| 2011/0198609 A1* | 8/2011 | Huang | H01L 33/382 257/76 |
| 2011/0204395 A1* | 8/2011 | Hong | H01L 33/382 257/94 |
| 2012/0007101 A1* | 1/2012 | Yang | H01L 33/387 257/76 |
| 2012/0049219 A1* | 3/2012 | Kamiya | H01L 33/382 257/98 |
| 2012/0049236 A1* | 3/2012 | Kamiya | H01L 33/20 257/99 |
| 2012/0074441 A1* | 3/2012 | Seo | H01L 27/153 257/91 |
| 2012/0112226 A1* | 5/2012 | Grolier | H01L 33/382 257/98 |
| 2015/0236070 A1* | 8/2015 | Moosburger | H01L 27/15 257/99 |

FOREIGN PATENT DOCUMENTS

| | | |
|---|---|---|
| JP | 2006-245232 A | 9/2006 |
| JP | 2007-243074 A | 9/2007 |
| JP | 2008-053602 A | 3/2008 |
| JP | 2008-192782 A | 8/2008 |
| JP | 2008-263130 A | 10/2008 |
| JP | 2008-288548 A | 11/2008 |
| JP | 2009-088521 A | 4/2009 |
| JP | 2009-094319 A | 4/2009 |
| JP | 2010-056322 A | 3/2010 |
| JP | 2010-507246 A | 3/2010 |
| JP | 2010-161160 A | 7/2010 |
| JP | 2010-171382 A | 8/2010 |
| JP | 2011-066304 A | 3/2011 |
| WO | WO-2005/050748 A1 | 6/2005 |
| WO | WO-2009-113659 A1 | 9/2009 |

* cited by examiner

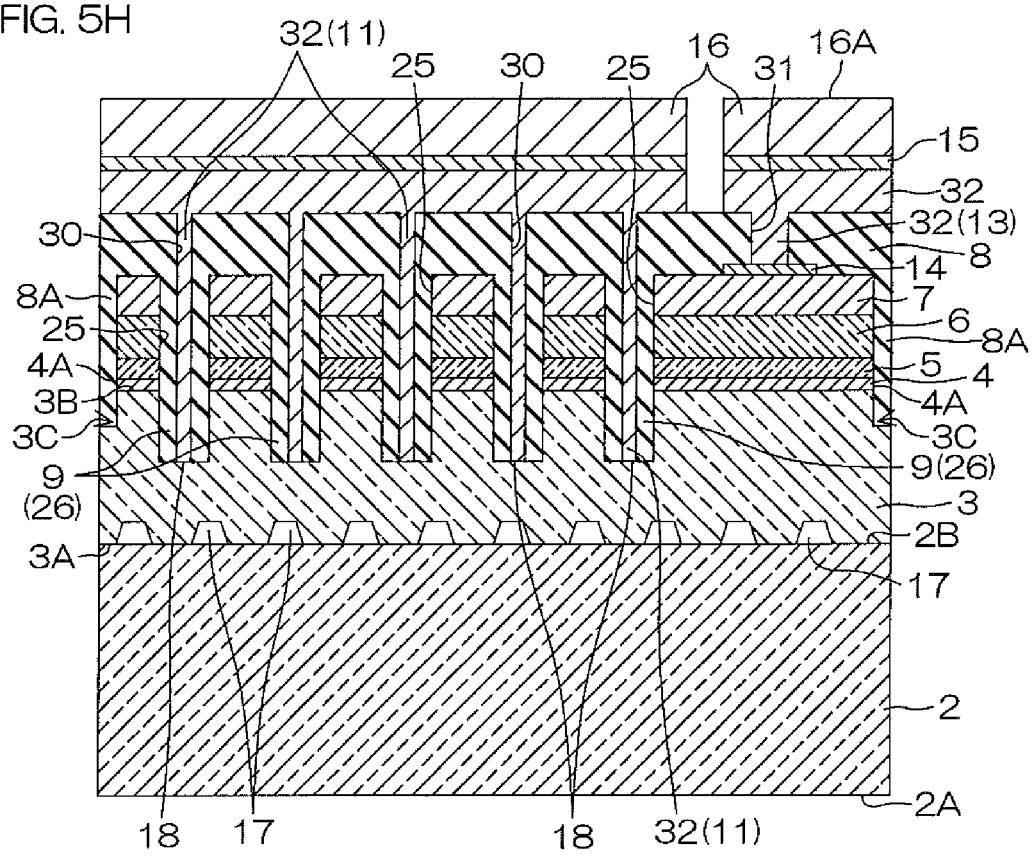

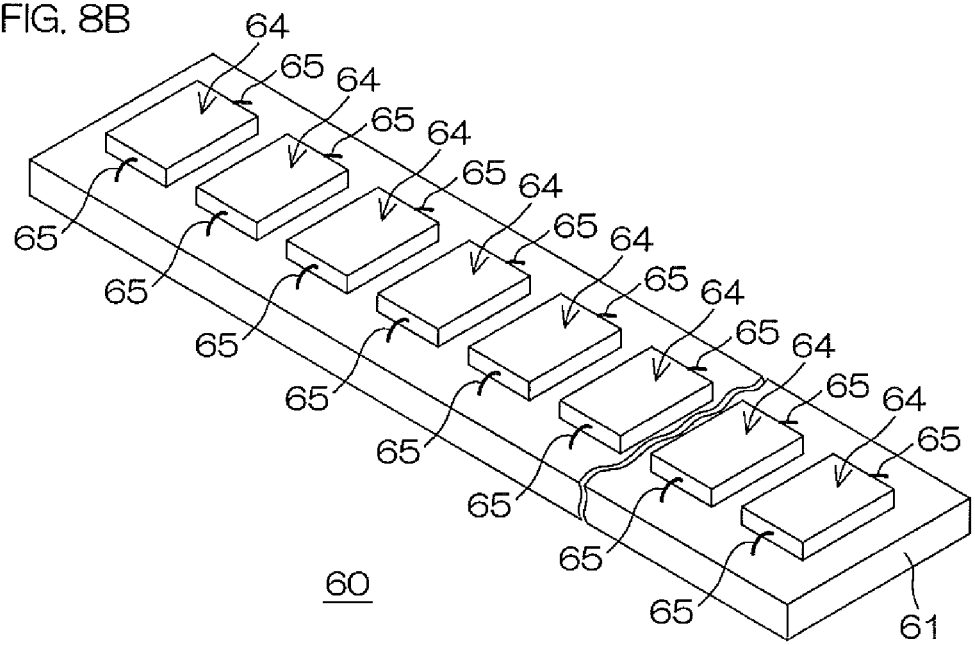
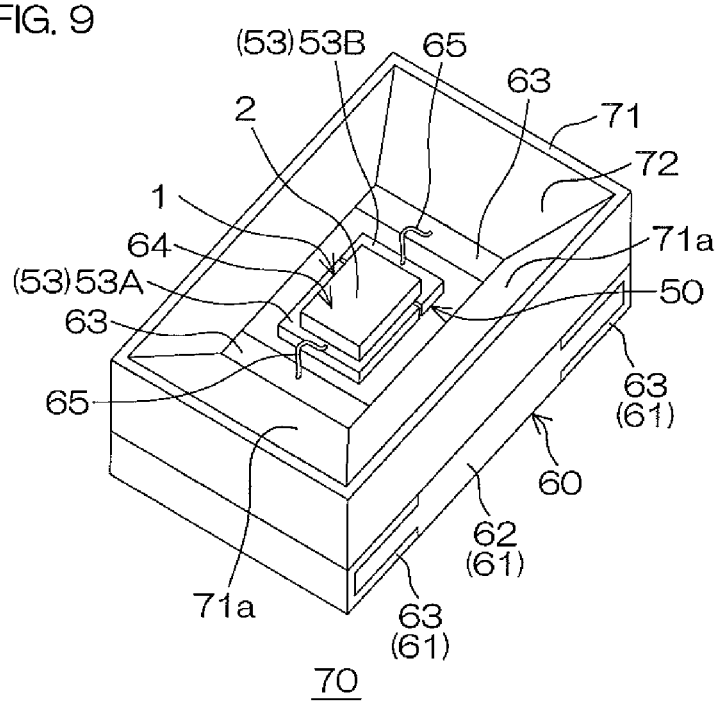

US 9,559,263 B2

LIGHT-EMITTING ELEMENT, LIGHT-EMITTING ELEMENT UNIT, AND LIGHT-EMITTING ELEMENT PACKAGE

This is a continuation of U.S. application Ser. No. 13/976,900, filed on Jun. 27, 2013, and allowed on Jun. 22, 2015, which was a National Stage application of PCT/JP2011/080278 filed on Dec. 27, 2011, and claims the benefit of priority of Japanese Patent Application No. 2010-290551, filed on Dec. 27, 2010. The disclosures of these prior U.S. and foreign applications are incorporated herein by reference.

TECHNICAL FIELD

The present invention relates to a light-emitting element, a light-emitting element unit including the same and a light-emitting element package prepared by covering a light-emitting element unit with a resin package.

BACKGROUND ART

A semiconductor light-emitting element related to one prior art is disclosed in Patent Document 1. In the semiconductor light-emitting element, an n-GaN layer is stacked on a sapphire substrate from which light is extracted. A light-emitting layer is stacked on the n-GaN layer, and a p-GaN layer, a reflecting electrode, a p electrode, a barrier layer and an AuSn layer are further stacked on the light-emitting layer, in this order from the side of the sapphire substrate. On the other hand, end regions of the p-GaN layer and the light-emitting layer are partially removed so that an end region of the n-GaN layer is exposed, and an n electrode is stacked on the exposed end region of the n-GaN layer in a state isolated from the light-emitting layer. A barrier layer and an AuSn layer are stacked on the n electrode, in this order from the side of the sapphire substrate. The respective ones of the AuSn layer on the n electrode and the AuSn layer on the p electrode are bonded to a wiring board. When voltage is applied between the n electrode and the p electrode in this state, light is generated from the light-emitting layer and extracted from the sapphire substrate.

PRIOR ART

Patent Document

Patent Document 1: Japanese Unexamined Patent Publication No. 2008-263130

SUMMARY OF THE INVENTION

Problems to be Solved by the Invention

In the structure directly stacking the n electrode on the n-GaN layer as in the semiconductor light-emitting element according to Patent Document 1, a contact portion must be enlarged in order to reduce contact resistance between the n electrode and the n-GaN layer. Therefore, a space for arranging the n electrode on the n-GaN layer must be ensured with a certain extent of width. Thus, a region where the light-emitting layer is arrangeable is corroded and narrowed. Therefore, the light-emitting layer cannot be enlarged, and hence it is difficult to attain improvement of luminous efficiency.

According to a study made by the inventors, further, current is about to flow through the shortest route between the p electrode an the n electrode, and hence the current cannot be sufficiently dispersed in the structure according to Patent Document 1 in which the n electrode is formed on the end region. Therefore, only a region in the vicinity of the n electrode emits light, and the entire light-emitting layer cannot be uniformly brightened.

In order to solve the problem, the inventors have studied a structure of an exposed n-type semiconductor layer having an end region and a plurality of branch portions extending from the end region and an n electrode arranged thereon.

However, it has been recognized that a light-emitting layer is further corroded due to arrangement of branch portions of the n electrode, the area of the light-emitting layer lessens and luminous efficiency deteriorates in such an electrode structure. More specifically, current density in the light-emitting layer rises following the area reduction of the light-emitting layer, and hence a loss takes place in light output due to a droop phenomenon. The droop phenomenon denotes such a phenomenon that a radiative recombination probability lowers due to heat generation resulting from current concentration and internal luminous efficiency deteriorates.

Accordingly, the present invention provides a light-emitting element capable of attaining improvement of luminous efficiency by overcoming the aforementioned technical problems, a light-emitting element unit including the same and a light-emitting element package prepared by covering a light-emitting element unit with a resin package.

Means for Solving the Problems

A light-emitting element according to the present invention includes a first conductivity type semiconductor layer (a semiconductor layer of a first conductivity type), a light-emitting layer stacked on the first conductivity type semiconductor layer, a second conductivity type semiconductor layer (a semiconductor layer of a second conductivity type different from the first conductivity type) stacked on the light-emitting layer, a transparent electrode layer, stacked on the second conductivity type semiconductor layer, transparent with respect to the emission wavelength of the light-emitting layer, a reflecting electrode layer, stacked on the transparent electrode layer, reflecting light transmitted through the transparent electrode layer, an insulating layer stacked on the reflecting electrode layer, a first electrode layer stacked on the insulating layer, a second electrode layer stacked on the insulating layer in a state isolated from the first electrode layer, a plurality of insulating tube layers, discretely arranged in plan view as viewed from the thickness direction of the first conductivity type semiconductor layer, passing through the reflecting electrode layer, the transparent electrode layer, the second conductivity type semiconductor layer and the light-emitting layer continuously from the insulating layer and reaching the first conductivity type semiconductor layer, first contacts, continuous from the first electrode layer, connected to the first conductivity type semiconductor layer through the insulating layer and the insulating tube layers, and second contacts, continuous from the second electrode layer, passing through the insulating layer to be connected to the reflecting electrode layer (Claim 1).

Specifically, the wording "transparent with respect to the emission wavelength" denotes a case where the transmittance of the emission wavelength is not less than 60%, for example.

According to the structure, the first electrode layer on the insulating layer is connected to the first conductivity type semiconductor layer separated through the insulating layer, the reflecting electrode layer, the transparent electrode layer, the second conductivity type semiconductor layer and the light-emitting layer via the first contacts. The first contacts pass through the insulating tube layers, to be isolated from the reflecting electrode layer, the transparent electrode layer, the second conductivity type semiconductor layer and the light-emitting layer. The second electrode layer on the insulating layer is connected to the reflecting electrode layer under the insulating layer via the second contacts.

When applying voltage between the first electrode layer and the second electrode layer, current can be fed between the second electrode layer and the first electrode layer. Thus, carriers of either electrons or holes are supplied to the light-emitting layer from the second electrode layer through the second contacts, the reflecting electrode layer, the transparent electrode layer and the second conductivity type semiconductor layer, and the other carriers are supplied from the first electrode layer to the light-emitting layer through the first contacts and the first conductivity type semiconductor layer. Thus, light emission resulting from recombination of the carriers takes place in the light-emission layer. For example, most part of the generated light is transmitted through the first conductivity type semiconductor layer and extracted, while partial light is reflected on the interface between the transparent electrode layer and the reflecting electrode layer after the same is successively transmitted through the second conductivity type semiconductor layer and the transparent electrode layer, and thereafter extracted from the side of the first conductivity type semiconductor layer.

The plurality of insulating tube layers are discretely arranged in plan view, whereby the first contacts passing through the insulating tube layers are also plurally present, and discretely arranged. While the first electrode layer and the first conductivity type semiconductor layer separate from each other in this case, the same are connected with each other via the plurality of discretely arranged first contacts, whereby current can be smoothly fed between the first electrode layer and the first conductivity type semiconductor layer to an extent similar to that in a case where the first electrode layer is directly stacked on the first conductivity type semiconductor layer.

As compared with a contact area between the first electrode layer and the first conductivity type semiconductor layer in the case where the first electrode layer is directly stacked on the first conductivity type semiconductor layer, contact areas between the plurality of discretely arranged first contacts and the first conductivity type semiconductor layer can be suppressed small. This is because the first contacts are so discretely arranged that light can be efficiently emitted over a wide range by easily dispersing current in a wide area range even if the total contact areas are small. Thus, a region of the first conductivity type semiconductor layer for arranging the light-emitting layer can be inhibited from being corroded by a structure for connecting the first electrode layer and the first conductivity type semiconductor layer with each other. In the light-emitting element, therefore, the area of the light-emitting layer can be enlarged, whereby current density in the light-emitting layer can be suppressed, and improvement of luminous efficiency can be attained in response thereto.

Preferably, the plurality of first contacts are uniformly dispersively arranged in the plan view (Claim 2). According to the structure, contact portions between the first contacts and the first conductivity type semiconductor are uniformly distributed over a wide range in the first conductivity type semiconductor layer, whereby current uniformly spreads over a wide range in the light-emitting layer. Thus, the number of lucent portions in the light-emitting layer can be further increased, whereby further improvement of the luminous efficiency of the light-emitting element can be attained. In addition, carriers can be smoothly supplied from the first electrode layer to the first conductivity type semiconductor layer through the contact portions uniformly distributed over a wide range.

Preferably, the plurality of first contacts are so arranged that the interval between one first contact and another first contact closest to the first contact is constant, in order to uniformly dispersively arrange the plurality of first contacts in the plan view (Claim 3). At this time, the interval is preferably not less than 50 µm and not more than 150 µm (Claim 4).

Preferably, the plurality of first contacts are arranged in the form of a matrix (Claim 5).

Preferably, the plurality of first contacts are arranged to be point-symmetrical with respect to the location of the center of gravity of the first electrode layer in the plan view (Claim 6).

Preferably, the plurality of first contacts include a first edge-side contact arranged along an edge of the first electrode layer in the plan view (Claim 7). According to the structure, the contact portions are arranged at least on the edge side in the first semiconductor layer, in response to the first edge-side contact. Thus, current can be spread up to the edge side in the light-emitting layer on the first conductivity type semiconductor layer. Therefore, the number of lucent portions in the light-emitting layer can be increased, whereby improvement of the luminous efficiency of the light-emitting element can be attained.

Preferably, the plurality of first contacts include a second edge-side contact arranged along an edge of the first electrode layer opposite to the side of the second electrode layer in the plan view (Claim 8). According to the structure, the contact portions are arranged at least on the side of the edge opposite to the side of the second electrode layer in the first conductivity type semiconductor layer, in response to the second edge-side contact. Thus, current can be spread up to the side of the edge opposite to the side of the second electrode layer in the light-emitting layer on the first conductivity type semiconductor layer. Therefore, the number of lucent portions in the light-emitting layer can be increased, whereby improvement of the luminous efficiency of the light-emitting element can be attained.

Preferably, contact portions of the first contacts with respect to the first conductivity type semiconductor layer have circular shapes (Claim 9). According to the structure, carriers can be isotropically supplied from the whole peripheries of the circular shapes on the contact portions of the first contacts. Thus, the carriers can be smoothly supplied from the first contacts to the first conductivity type semiconductor layer.

Preferably in this case, the diameter of the contact portions is not less than 20 µm and not more than 40 µm (Claim 10).

Preferably, the first contacts have columnar shapes (Claim 11).

Preferably, the sum of the areas of the contact portions of all first contacts with respect to the first conductivity type semiconductor layer is not less than 3000 µm$^2$ and not more than 25000 µm$^2$ (Claim 12). According to this structure, improvement of the luminous efficiency can be attained in the light-emitting element, while lowering forward voltage.

Preferably, the insulating layer is made of SiN (Claim 13).

Preferably, the reflecting electrode layer is made of an alloy containing silver, a platinum group metal and copper (Claim 14). Preferably, the platinum group metal is platinum or palladium (Claim 15).

Preferably, the transparent electrode layer is made of ITO (indium tin oxide) (Claim 16).

Preferably, the first electrode layer includes a second reflecting electrode layer, in contact with the insulating layer and having the first contacts, reflecting light transmitted through the insulating layer (Claim 17). According to the structure, light-reflecting efficiency can be improved by reflecting light not reflected on the reflecting electrode layer (a first reflecting electrode layer) stacked on the transparent electrode layer but transmitted through the insulating layer by the second reflecting electrode layer, whereby improvement of the luminous efficiency of the light-emitting element can be attained.

Preferably, the second reflecting electrode layer is made of Al (Claim 18).

Preferably, the light-emitting element further includes a substrate, transparent with respect to the emission wavelength of the light-emitting layer, on which the first conductivity type semiconductor layer is stacked (Claim 19). In the light-emitting element, light is extracted from the substrate when the light-emitting layer emits the light.

Preferably, the first conductivity type semiconductor layer and the second conductivity type semiconductor layer are made of nitride semiconductors (Claim 20).

Preferably, the insulating layer covers an end surface of the light-emitting layer exposed from between the first conductivity type semiconductor layer and the second conductivity type semiconductor layer (Claim 21). Thus, the end surface of the light-emitting layer can be protected. Further, light can be prevented from leaking from the end surface of the light-emitting layer when the light-emitting layer emits the light, whereby improvement of the luminous efficiency of the light-emitting element can be attained.

Preferably, the light-emitting element further includes an etching stopper layer, stacked on the reflecting electrode layer, arranged between the reflecting electrode layer and the second contacts (Claim 22). According to the structure, etching is stopped on the etching stopper layer when forming trenches for arranging the second contacts on the insulating layer by the etching, whereby the reflecting electrode layer can be prevented from being corroded.

Preferably, the light-emitting element further includes bonding layers stacked on the respective ones of the first electrode layer and the second electrode layer (Claim 23). Preferably, the bonding layers are made of AuSn (Claim 24). Thus, a light-emitting element unit including the light-emitting element and a submount bonded to the bonding layers is constituted (Claim 25), and voltage can be applied from the submount to the light-emitting element.

Further, a light-emitting element package including the light-emitting element unit and a resin package storing the light-emitting element unit can be constituted (Claim 26).

BRIEF DESCRIPTION OF THE DRAWINGS

FIG. 5H is an illustrative sectional view showing a step subsequent to FIG. 5G.

FIG. 8B is an illustrative perspective view showing a structural example of the light-emitting device.

FIG. 9 is a schematic perspective view of a light-emitting element package.

MODES FOR CARRYING OUT THE INVENTION

An embodiment of the present invention is now described in detail with reference to the attached drawings.

Figure 1:
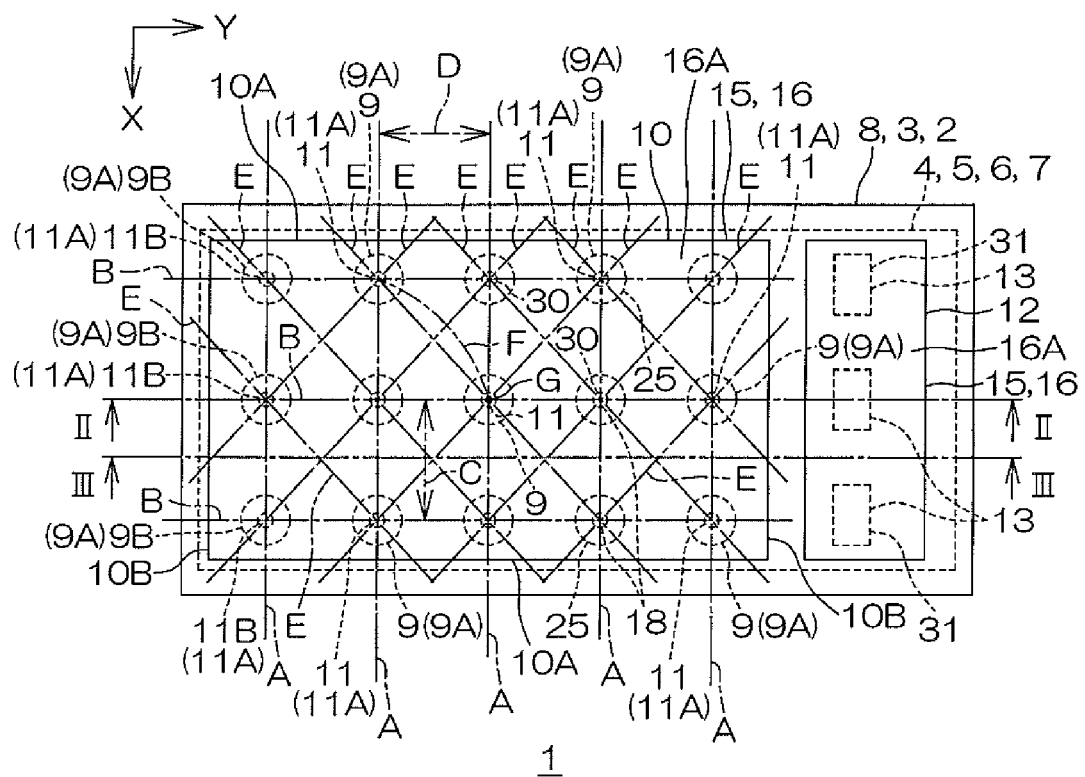
FIG. 1 is a schematic plan view of a light-emitting element according to one embodiment of the present invention.
Figure 2:
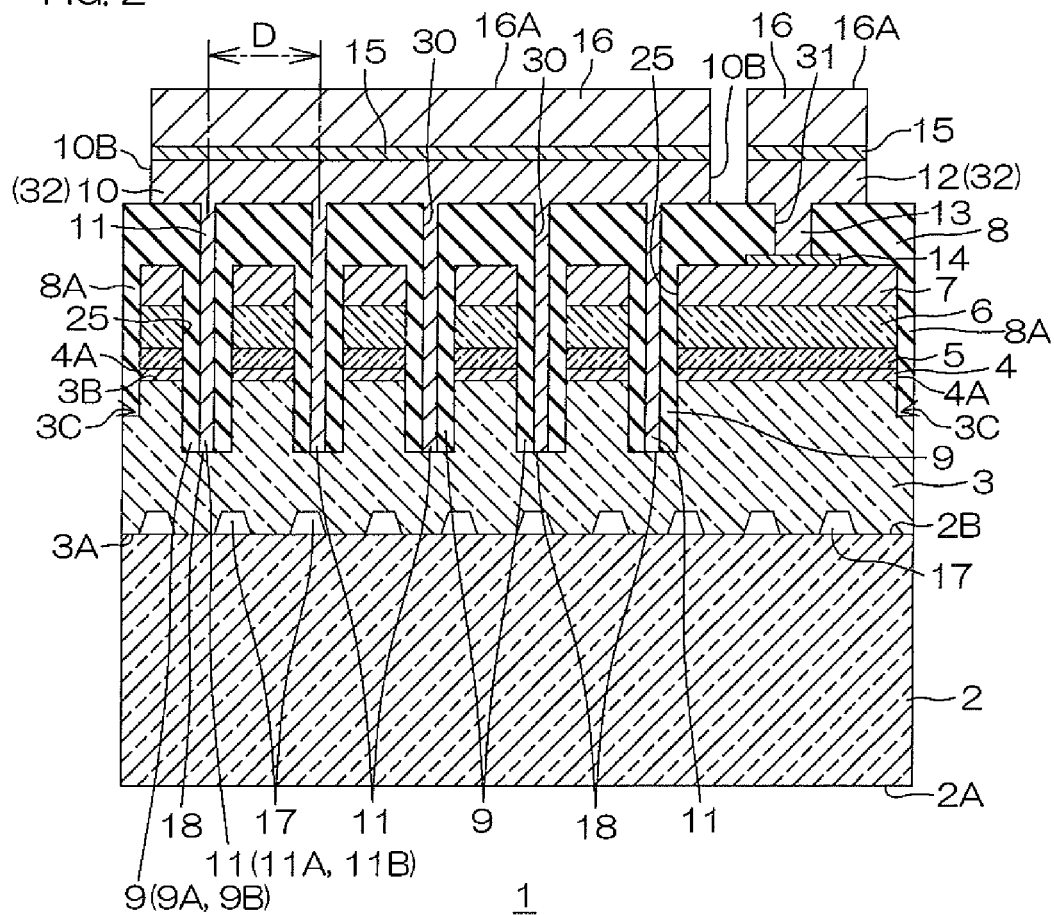
FIG. 2 is a sectional view taken along a cutting plane line II-II in FIG. 1.
Figure 3:
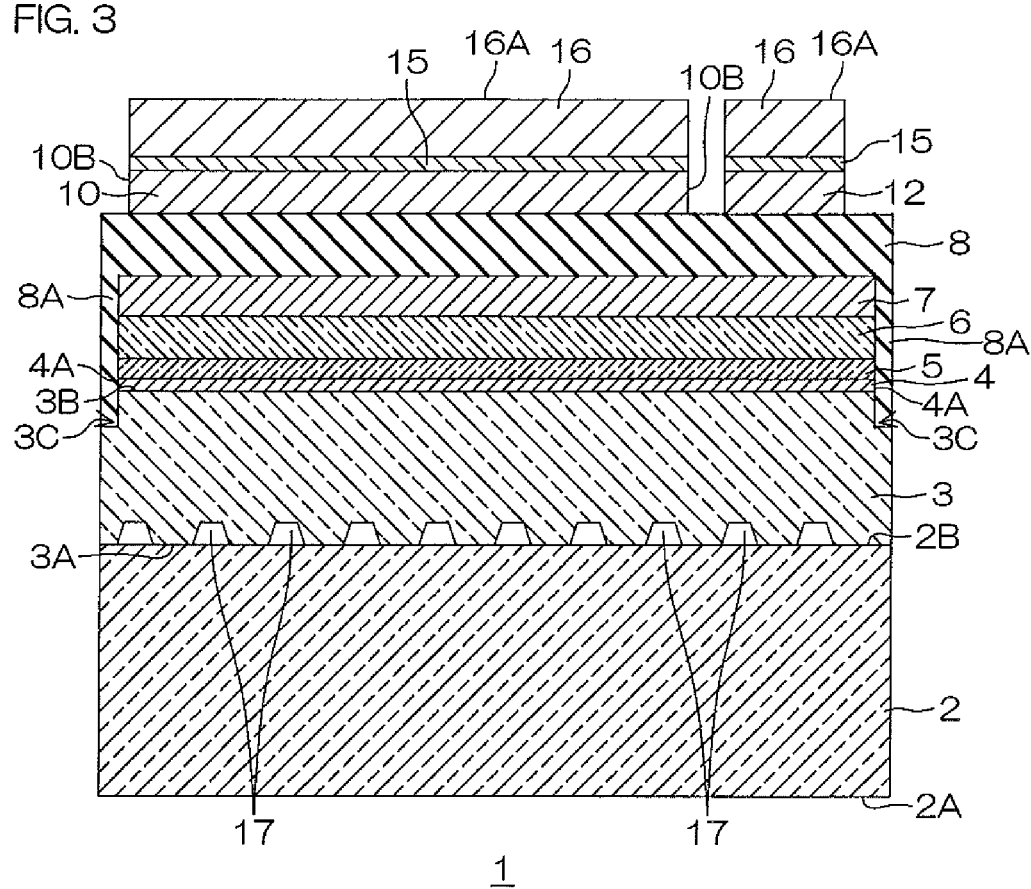
FIG. 3 is a sectional view taken along a cutting plane line III-III in FIG. 1.
Figure 4:
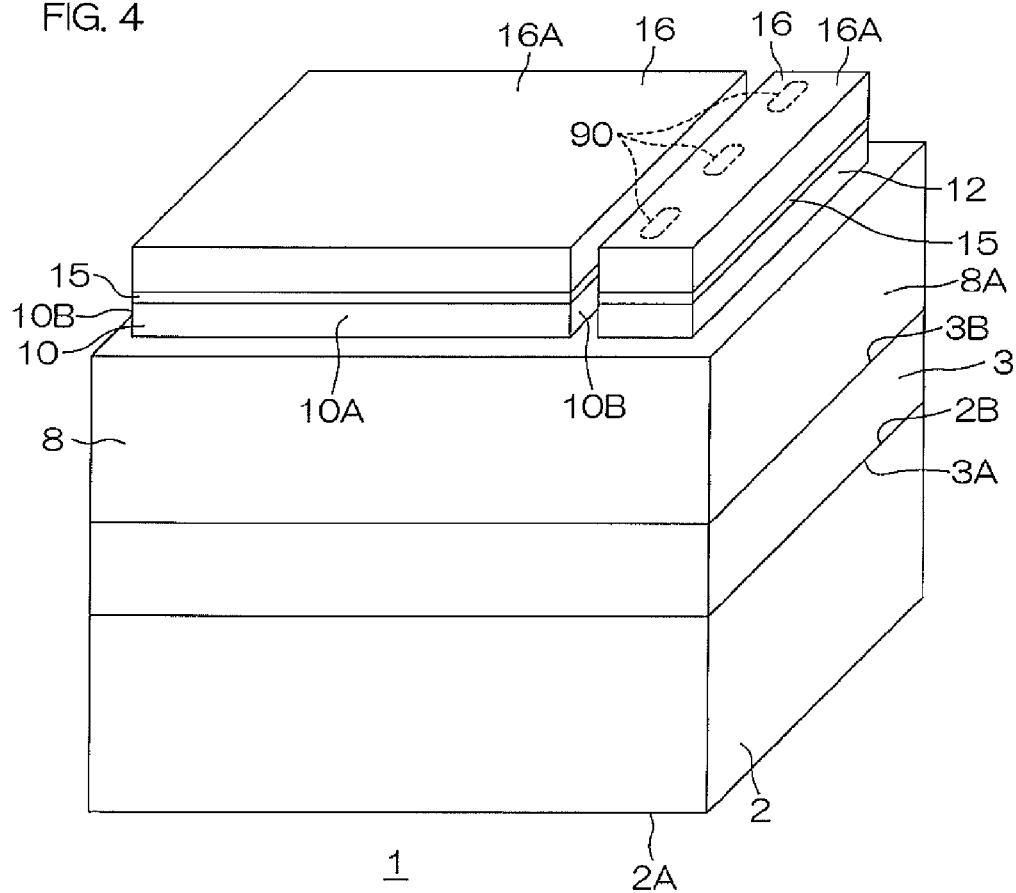
FIG. 4 is a schematic perspective view of the light-emitting element.

FIG. 1 is a schematic plan view of a light-emitting element 1 according to one embodiment of the present invention. FIG. 2 is a sectional view taken along a cutting plane line II-II in FIG. 1. FIG. 3 is a sectional view taken along a cutting plane line III-III in FIG. 1. FIG. 4 is a schematic perspective view of the light-emitting element 1.

The light-emitting element 1 includes a substrate 2, a first conductivity type semiconductor layer 3, a light-emitting layer 4, a second conductivity type semiconductor layer 5, a transparent electrode layer 6, a reflecting electrode layer 7, an insulating layer 8, insulating tube layers 9, a first electrode layer 10 (an n-side electrode), first contacts 11, a second electrode layer 12 (a p-side electrode), second contacts 13, an etching stopper layer 14, barrier layers 15, and bonding layers 16.

The first conductivity type semiconductor layer 3, the light-emitting layer 4, the second conductivity type semiconductor layer 5, the transparent electrode layer 6, the reflecting electrode layer 7 and the insulating layer 8 are stacked in this order on the substrate 2.

The substrate 2 is made of a material (sapphire, GaN or SiC, for example) transparent with respect to the emission wavelength (450 nm, for example) of the light-emitting layer 4, and has a prescribed thickness. The substrate 2 is provided in the form of a rectangle having a longitudinal direction in the right-and-left direction in FIG. 2 and having a short-side direction in the depth direction in FIG. 2 in plan view as viewed from the thickness direction thereof (see FIG. 1). The longitudinal size of the substrate 2 is about 1000 μm, for example, and the short-side size of the substrate 2 is about 500 μm, for example. In the substrate 2, the lower surface in FIG. 2 is a front surface 2A, and the upper surface in FIG. 2 is a rear surface 2B. The front surface 2A is a light extraction surface from which light is extracted. The rear surface 2B is a surface of the substrate 2 bonded to the first conductivity type semiconductor layer 3. A plurality of projections 17 protruding toward the side of the first conductivity type semiconductor layer 3 are formed on the rear surface 2B of the substrate 2. The plurality of projections 17 are discretely arranged. More specifically, the plurality of projections 17 may be arranged in the form of a matrix at intervals from one another, or may be arranged in a staggered manner on the rear surface 2B of the substrate 2. Each projection 17 may be made of SiN.

The first conductivity type semiconductor layer 3 is stacked on the substrate 2. The first conductivity type semiconductor layer 3 covers the whole area of the rear surface 2B of the substrate 2. The first conductivity type semiconductor layer 3 is an n-type semiconductor layer according to the embodiment, and more specifically, the same is made of an n-type nitride semiconductor (GaN, for example), and transparent with respect to the emission wavelength of the light-emitting layer 4. As to the first conductivity type semiconductor layer 3, it is assumed that the lower surface covering the rear surface 2B of the substrate 2 in FIG. 2 is referred to as a front surface 3A, and the upper surface opposite to the front surface 3A is referred to as a rear surface 3B. Stepped portions 3C concaved toward the side of the front surface 3A are formed on end portions of the rear surface 3B of the first conductivity type semiconductor layer 3 in plan view as viewed from the thickness direction of the substrate 2 (also the thickness direction of the first conductivity type semiconductor layer 3).

The light-emitting layer 4 is stacked on the first conductivity type semiconductor layer 3. The light-emitting layer 4 covers the whole area, excluding the stepped portions 3C, of the rear surface 3B of the first conductivity type semiconductor layer 3. The light-emitting layer 4 is made of a nitride semiconductor (InGaN, for example) containing In according to the embodiment, and the thickness thereof is about 100 nm, for example. The emission wavelength of the light-emitting layer 4 is 440 nm to 460 nm, for example.

The second conductivity type semiconductor layer 5 is stacked on the light-emitting layer 4 in the same pattern as the light-emitting layer 4. In plan view, therefore, the region of the second conductivity type semiconductor layer 5 coincides with the region of the light-emitting layer 4. The second conductivity type semiconductor layer 5 is a p-type semiconductor layer according to the embodiment, and more specifically, the same is made of a p-type nitride semiconductor (GaN, for example), and transparent with respect to the emission wavelength of the light-emitting layer 4. Thus, a light-emitting diode structure holding the light-emitting layer 4 with the first conductivity type semiconductor layer 3 which is an n-type semiconductor layer and the second conductivity type semiconductor layer 5 which is a p-type semiconductor layer is formed. The thickness of the second conductivity type semiconductor layer 5 is about 200 nm, for example. In this case, the total thickness of the first conductivity type semiconductor layer 3, the light-emitting layer 4 and the second conductivity type semiconductor layer 5 is about 4.5 μm, for example.

The transparent electrode layer 6 is stacked on the second conductivity type semiconductor layer 5 in the same pattern as the second conductivity type semiconductor layer 5. The transparent electrode layer 6 is made of ZnO (zinc oxide) or ITO (indium tin oxide), and transparent with respect to the emission wavelength of the light-emitting layer 4. According to the embodiment, the transparent electrode layer 6 is made of ITO.

The reflecting electrode layer 7 is stacked on the transparent electrode layer 6 in the same pattern as the transparent electrode layer 6. The reflecting electrode layer 7 is made of an alloy containing silver, a platinum group metal and copper. Platinum or palladium can be employed as the platinum group metal. As to the compounding ratios of the respective metals, that of silver is about 98%, and that of each of the platinum group metal and copper is about 1%. The reflecting electrode layer 7 made of such an alloy is excellent in conductivity.

The insulating layer 8 is stacked on the reflecting electrode layer 7. Extensional portions 8A extending toward the side of the substrate 2 are integrally provided on end portions of the insulating layer 8 in plan view. The extensional portions 8A are parts of the insulating layer 8. The extensional portions 8A cover outer end surfaces of the respective ones of the light-emitting layer 4, the second conductivity type semiconductor layer 5, the transparent electrode layer 6 and the reflecting electrode layer 7 in plan view and the stepped portions 3C of the first conductivity type semiconductor layer 3 over the whole areas. The outer end surfaces of the light-emitting layer 4 are end surfaces 4A of the light-emitting layer 4 exposed from between the first conductivity type semiconductor layer 3 and the second conductivity type semiconductor layer 5. The insulating layer 8 and the extensional portions 8A are made of an insulating material (SiN, for example).

The insulating tube layers 9 are made of an insulating material (the same material as the insulating layer 8 in this case). The insulating tube layers 9 are tubular layers continuous from the insulating layer 8 and extending toward the side of the substrate 2 along the thickness direction of the substrate 2. According to the embodiment, the insulating tube layers 9 are in the form of linear circular tubes, and the outer diameter thereof is not less than 30 μm and not more than 50 μm, while the thickness thereof is about 10 μm to 20 μm. The insulating tube layers 9 pass through the reflecting electrode layer 7, the transparent electrode layer 6, the second conductivity type semiconductor layer 5 and the light-emitting layer 4, and reach an intermediate portion of the thickness of the first conductivity type semiconductor layer 3.

The insulating tube layers 9 are plurally provided, and the plurality of insulating tube layers 9 are discretely arranged in plan view. More specifically, the plurality of insulating tube layers 9 are uniformly dispersively arranged in plan view.

Referring to FIG. 1, the plurality of insulating tube layers 9 are arranged along the respective ones of first array lines A extending in a first direction X parallel to the major surface of the substrate 2 and second array lines B extending in a second direction Y intersecting with the first direction X and parallel to the major surface of the substrate 2. According to the embodiment, the number of the insulating tube layers 9 is 15, and the insulating tube layers 9 are arranged in the form of a matrix with three rows and five columns. In this case, the first direction X (the row direction) coincides with the short-side direction of the substrate 2, the second direction Y (the column direction) coincides with the longitudinal direction of the substrate 2, and the first array lines A (the first direction X) and the second array lines B (the second direction Y) are orthogonal to one another. Three insulating tube layers 9 are arrayed on each first array line A at regular intervals, and five insulating tube layers 9 are arrayed on each second array line B at regular intervals.

The first array lines A and the second array lines B pass through the circle centers of the insulating tube layers 9 in the form of circular tubes. Therefore, the interval between the insulating tube layers 9 adjacent to each other on each first array line A corresponds to the interval C between the second array lines B parallelly extending adjacently to each other. Further, the interval between the insulating tube layers 9 adjacent to each other on each second array line B corresponds to the interval D between the extending first array lines A parallelly extending adjacently to each other.

Consider third array lines E inclininlgy extending with respect to the first array lines A as well as the second array lines B in a plane parallel to the major surface of the substrate 2. The third array lines E are present on the adjacent first array lines A, and pass through the circle centers of the insulating tube layers 9 present on the adjacent second array lines B. When the intervals C and D are equal to each other, the third array lines E extend while inclining at 45° with respect to the first array lines A as well as the second array lines B, and a plurality of insulating tube layers 9 line up on each third array line E at regular intervals F. Thus, the plurality of insulating tube layers 9 are so arrayed on the respective ones of the first array lines A, the second array lines B and the third array lines E that the interval (the intervals C, D and F) between one insulating tube layer 9 and the insulating tube layer 9 closest to the insulating tube layer 9 is constant. In the case where the insulating tube layers 9 are arranged in the form of a matrix as in the embodiment, the interval F is greater than the intervals C and D. In the case where the intervals C and D are equal to each other, the interval between one insulating tube layer 9 and another insulating tube layer 9 closest thereto is equal to the intervals C and D. The interval C or D (the distance between the closest insulating tube layers 9) is set to be not less than 50 μm and not more than 150 μm.

Considering a line segment connecting the circle centers of a pair of insulating tube layers 9 adjacent to each other on any third array line E with each other, the midpoint of the line segment is the point (the farthest point) farthest from the insulating tube layers 9 present on the periphery thereof. The plane arrangement of the insulating tube layers 9 is preferably so designed that the distance between such a farthest point and the insulating tube layer 9 (the first contact 11 arranged in the insulating tube layer 9) closest thereto is not more than 150 μm.

Referring to FIG. 2, the first electrode layer 10 is stacked on a region of the insulating layer 8 deviating toward the left side in FIG. 2. The first electrode layer 10 is provided in the form of a rectangle longitudinal in the right-and-left direction in FIGS. 1 and 2 (the longitudinal direction of the substrate 2) in plan view, occupies a region of not less than half the insulating layer 8 in plan view, and is in contact with the insulating layer 8 in the region (see FIG. 1). The first electrode layer 10 is made of a conductive material (Al (aluminum) or Ag (silver), for example). The thickness of the first electrode layer 10 is not less than 100 nm, and preferably about 350 nm. Referring to FIG. 1, the first electrode layer 10 includes a pair of longitudinal edges 10A extending in the right-and-left direction in FIG. 1 and a pair of short-side edges 10B extending orthogonally to the pair of longitudinal edges 10A. The longitudinal edges 10A and the short-side edges 10B are sides defining the outer shape (the contour) of the first electrode layer 10 in plan view.

In plan view, one insulating tube layer 9 included in the plurality of insulating tube layers 9 is arranged on the location G of the center of gravity of the rectangular first electrode layer 10, while the remaining insulating tube layers 9 are arranged to be point-symmetrical with respect to (the center of symmetry of) the location G of the center of gravity. The plurality of insulating tube layers 9 include first edge-side insulating tube layers 9A arranged along the longitudinal edges 10A and the short-side edges 10B of the first electrode layer 10. Referring to FIG. 1, 12 first edge-side insulating tube layers 9A constitute a rectangular frame as a whole, and are arranged adjacently to outer lines (the longitudinal edges 10A and the short-side edges 10B) of the first electrode layer 10 to edge the outer lines.

The first contacts 11 are made of a conductive material (the same material as the first electrode layer 10 in this case). When made of the same material as the first electrode layer 10, the first contacts 11 may be integrated with the first electrode layer 10, or may also be regarded as parts of the first electrode layer 10. The first contacts 11 are continuous from the first electrode layer 10, and provided in the form of pillars extending toward the side of the substrate 2 along the thickness direction of the substrate 2. According to the embodiment, the first contacts 11 are in the form of linear columns. The first contacts 11 are plurally provided. According to the embodiment, the first contacts 11 are provided in the same number (15) as the insulating tube layers 9. Each first contact 11 passes through the insulating layer 8, and is embedded in a hollow portion of the corresponding insulating tube layer 9. In this state, each first contact 11 is connected to the first conductivity type semiconductor layer 3 through the insulating layer 8 and the insulating tube layer 9. The first contacts 11 are isolated from the reflecting electrode layer 7, the transparent electrode layer 6, the second conductivity type semiconductor layer 5 and the light-emitting layer 4 by passing through the insulating tube layers 9. Contact portions 18 of the columnar first contacts 11 with respect to the first conductivity type semiconductor layer 3 have circular shapes. The diameter of the contact portions 18 may be not less than 20 μm and not more than 40 μm, for example, and preferably about 30 μm, in consideration of dimensional errors of the first contacts 11 and errors in the intervals between the adjacent first contacts 11. When reducing the diameter of the contact portions 18 below 20 μm, electrical resistance (contact resistance) in the contact portions 18 increases.

The sum of the areas (contact areas) of the contact portions 18 of all (in this case, 15) first contacts 11 is preferably not less than 3000 μm² and not more than 25000 μm².

Referring to FIG. 1, the circle centers of the insulating tube layers 9 in the form of circular tubes and the circle centers of the columnar first contacts 11 embedded in the hollow portions of the insulating tube layers 9 coincide with one another in plan view. Therefore, the plurality of first contacts 11 are arrayed in the same array pattern as the plurality of insulating tube layers 9 in plan view. In other words, the plurality of first contacts 11 are arranged on the intersection points between the first array lines A and the second array lines B in plan view, and uniformly dispersively arranged to form a matrix. Further, the plurality of first contacts 11 are so arrayed that the interval between one first contact 11 and the first contact 11 closest to the first contact 11 is constant at each of the aforementioned intervals C, D and F on each of the first array lines A, the second array lines B and the third array lines E. In addition, the plurality of first contacts 11 are arranged to be point-symmetrical with respect to the location G of the center of gravity of the first electrode layer 10 in plan view. It is assumed that the first contacts 11 embedded inside the aforementioned first edge-side insulating tube layers 9A are referred to as first edge-side contacts 11A among the plurality of first contacts 11. The first edge-side contacts 11A are arranged along the longitudinal edges 10A and the short-side edges 10B of the first electrode layer 10 in plan view.

Referring to FIG. 2, the second electrode layer 12 is made of the same material as the first electrode layer 10 according to the embodiment, and stacked on a region of the insulating layer 8 deviating toward the right side in FIG. 2. The second electrode layer 12 has the same thickness as the first electrode layer 10, although the same is smaller than the first electrode layer 10 in plan view. The second electrode layer 12 is longitudinal in a direction (the direction orthogonal to the plane of FIG. 2) orthogonal to the longitudinal direction (the right-and-left direction in FIGS. 1 and 2) of the first electrode layer 10 (see FIG. 1). On the insulating layer 8, the first electrode layer 10 formed to deviate toward the left side and the second electrode layer 12 formed to deviate toward the right side are isolated from each other by separating from each other at a distance of about 60 μm, for example.

It is assumed that three first edge-side insulating tube layers 9A arranged along the edge (the left short-side edge 10B in FIG. 1) of the first electrode layer 10 opposite to the side of the second electrode layer 12 in plan view are referred to as second edge-side insulating tube layers 9B in the aforementioned first edge-side insulating tube layers 9A. It is also assumed that the first edge-side contacts 11A embedded inside the three second edge-side insulating tube layers 9B are referred to as second edge-side contacts 11B among the first edge-side contacts 11A embedded inside the first edge-side insulating tube layers 9A. The second edge-side contacts 11B are arranged along the left short-side edge 10B in plan view.

The second contacts 13 are made of a conductive material (the same material as the second electrode layer 12 in this case). The second contacts 13 are continuous from the second electrode layer 12, and provided in the form of pillars extending toward the side of the substrate 2 along the thickness direction of the substrate 2. The second contacts 13 are plurally (by three in this case) provided. The plurality of second contacts 13 line up along the longitudinal direction (the direction orthogonal to the plane of FIG. 2) of the second electrode layer 12 (see FIG. 1). Each second contact 13 passes through the insulating layer 8.

The etching stopper layer 14 is stacked on a position of the reflecting electrode layer 7 coinciding with each second contact 13 in plan view, and formed to be larger than the second contact 13 in plan view. The etching stopper layer 14 is made of a conductive material, and more specifically, the same is constituted by stacking Cr (chromium) and Pt (platinum) in this order from the side of the reflecting electrode layer 7. The etching stopper layer 14 is held between the reflecting electrode layer 7 and the second contacts 13. The second contacts 13 are connected to the reflecting electrode layer 7 through the etching stopper layer 14.

The barrier layers 15 are stacked on the first electrode layer 10 in the same pattern as the first electrode layer 10, and stacked on the second electrode layer 12 in the same pattern as the second electrode layer 12. The barrier layers 15 are constituted by stacking Ti (titanium) and Pt in this order from the side of the first electrode layer 10 and the second electrode layer 12.

The bonding layers 16 are stacked on the barrier layer 15 present on the first electrode layer 10 in the same pattern as the first electrode layer 10, and stacked on the barrier layer 15 present on the second electrode layer 12 in the same pattern as the second electrode layer 12. The bonding layers 16 are made of Ag, Ti or Pt, or an alloy thereof, for example. The bonding layers 16 may be made of solder or AuSn (gold tin). According to the embodiment, the bonding layers 16 are made of AuSn. Diffusion of Sn (tin) from the bonding layers 16 into the first electrode layer 10 and the second electrode layer 12 is suppressed by the barrier layers 15.

Surfaces of the bonding layers 16 in contact with the barrier layers 15 present on the first electrode layer 10 and the second electrode layer 12 are lower surfaces, and it is assumed that upper surfaces opposite to the lower surfaces are referred to as bonding surfaces 16A. Both of the bonding surface 16A of the bonding layer 16 on the side of the first electrode layer 10 and the bonding surface 16A of the bonding layer 16 on the side of the second electrode layer 12 are planar surfaces, and flush with each other on the same height positions (positions in the thickness direction of the substrate 2). The first electrode layer 10 and the second electrode layer 12 are isolated from each other as hereinabove described, whereby the bonding layer 16 on the side of the first electrode layer 10 and the bonding layer 16 on the side of the second electrode layer 12 are isolated from each other.

A portion of the first conductivity type semiconductor layer 3 excluding the stepped portions 3C, the light-emitting layer 4, the second conductivity type semiconductor layer 5, the transparent electrode layer 6 and the reflecting electrode layer 7 coincide with one another in plan view, and are in the form of rectangles longitudinal in the right-and-left direction (the longitudinal direction of the substrate 2) in FIGS. 1 and 2 (see FIG. 1). The respective ones of the first conductivity type semiconductor layer 3, the light-emitting layer 4, the second conductivity type semiconductor layer 5, the transparent electrode layer 6 and the reflecting electrode layer 7 are present over the whole area of the substrate 2 in the longitudinal direction in a region where the insulating tube layers 9 and the first contacts 11 are not formed (see FIG. 3). The first electrode layer 10, the second electrode layer 12, the barrier layers 15 and the bonding layers 16 are positioned inside the light-emitting layer 4 (the second conductivity type semiconductor layer 5, the transparent electrode layer 6 and the reflecting electrode layer 7) in plan view (see FIG. 1).

When applying forward voltage between the first electrode layer 10 and the second electrode layer 12 in the light-emitting element 1, current flows from the second electrode layer 12 toward the first electrode layer 10. The current flows from the second electrode layer 12 toward the first electrode layer 10 through the second contacts 13, the etching stopper layer 14 and the reflecting electrode layer 7 in this order. The reflecting electrode layer 7 is excellent in conductivity, whereby the current spreads over the whole area of the reflecting electrode layer 7 in plan view, and thereafter flows through the transparent electrode layer 6, the second conductivity type semiconductor layer 5, the light-emitting layer 4, the first conductivity type semiconductor layer 3 and the first contacts 12 in this order. The current in this manner, whereby electrons are injected from the first conductivity type semiconductor layer 3 into the light-emitting layer 4 and holes are injected from the second conductivity type semiconductor layer 5 into the light-emitting layer 4, and the holes and the electrons are so recombined with one another in the light-emitting layer 4 that blue light of 440 nm to 460 nm in wavelength is generated. The light is transmitted through the first conductivity type semiconductor layer 3 and the substrate 2 in this order and extracted from the front surface 2A of the substrate 2.

At this time, there is also present light directed from the light-emitting layer 4 toward the side of the second conductivity type semiconductor layer 5, and the light is transmitted through the second conductivity type semiconductor layer 5 and the transparent electrode layer 6 in this order, and reflected on the interface between the transparent electrode layer 6 and the reflecting electrode layer 7. The reflected light is transmitted through the transparent electrode layer 6, the second conductivity type semiconductor layer 5, the light-emitting layer 4, the first conductivity type semiconductor layer 3 and the substrate 2 in this order and extracted from the front surface 2A of the substrate 2.

There is also present light not reflected on the reflecting electrode layer 7 but advancing in the insulating tube layers 9, and the light is transmitted through the insulating tube layers 9 and the insulating layer 8, and reflected on the interfaces between the insulating layer 8 and the first and second electrode layers 10 and 12. The reflected light is transmitted through the insulating layer 8, the insulating tube layers 9, the transparent electrode layer 6, the second conductivity type semiconductor layer 5, the light-emitting layer 4, the first conductivity type semiconductor layer 3 and the substrate 2 and extracted from the front surface 2A of the substrate 2. In other words, the light-emitting element 1 includes the first electrode layer 10 and the second electrode layer 12 as second reflecting electrode layers, in addition to the reflecting electrode layer 7 as a first reflecting electrode layer. The thicknesses of the first and second electrode layers 10 and 12 must be not less than 100 nm, so that the first and second electrode layers 10 and 12 have functions as the reflecting electrode layers.

As hereinabove described, the plurality of projections 17 are formed on the rear surface 2B of the substrate 2. Light introduced into the rear surface 2B of the substrate 2 at various angles from the side of the first conductivity type semiconductor layer 3 toward the substrate 2 can be inhibited from being totally reflected on the rear surface 2B of the substrate 2, due to the projections 17. Thus, the light directed toward the substrate 2 from the first conductivity type semiconductor layer 3 is inhibited from being reflected toward the side of the first conductivity type semiconductor layer 3 on the interface between the first conductivity type semiconductor layer 3 and the substrate 2. In other words, light extraction efficiency is improved.

FIGS. 5A to 5H are illustrative sectional views showing a method of manufacturing the light-emitting element shown in FIG. 2.

Figure 5A:
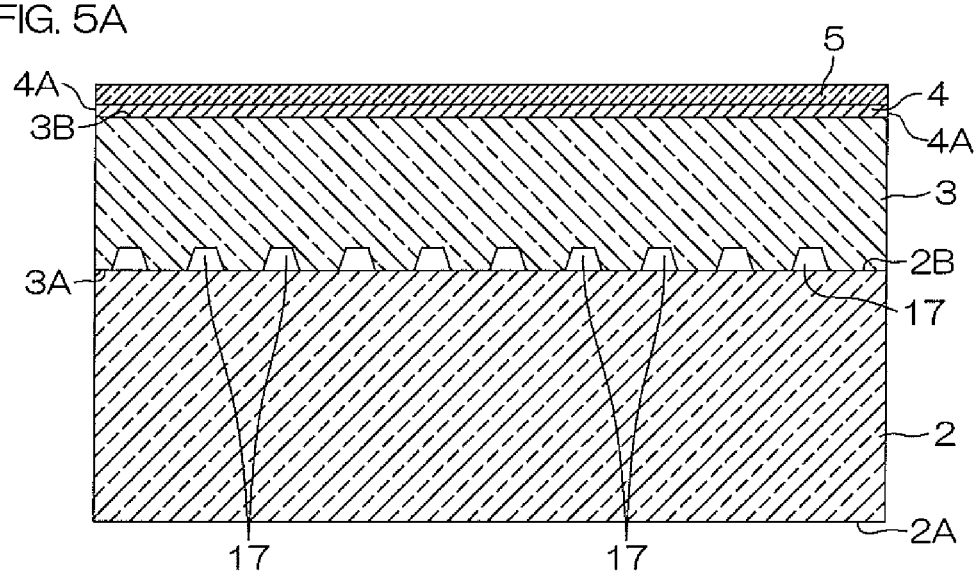
FIG. 5A is an illustrative sectional view showing a method of manufacturing the light-emitting element shown in FIG. 2.

First, a layer (an SiN layer) made of SiN is formed on the rear surface 2B of the substrate 2, and the SiN layer is separated into the plurality of projections 17 by etching employing a resist pattern (not shown) as a mask, as shown in FIG. 5A. Then, treatment of epitaxially growing a semiconductor layer on the rear surface 2B of the substrate 2 is performed by arranging the substrate 2 in a reaction vessel (not shown) and feeding gas (silane gas or the like) into the reaction vessel. At this time, the first conductivity type semiconductor layer 3, the light-emitting layer 4 and the second conductivity type semiconductor layer 5 can be continuously formed on the rear surface 2B of the substrate 2 in this order by varying the flow ratio of the gas.

Figure 5B:
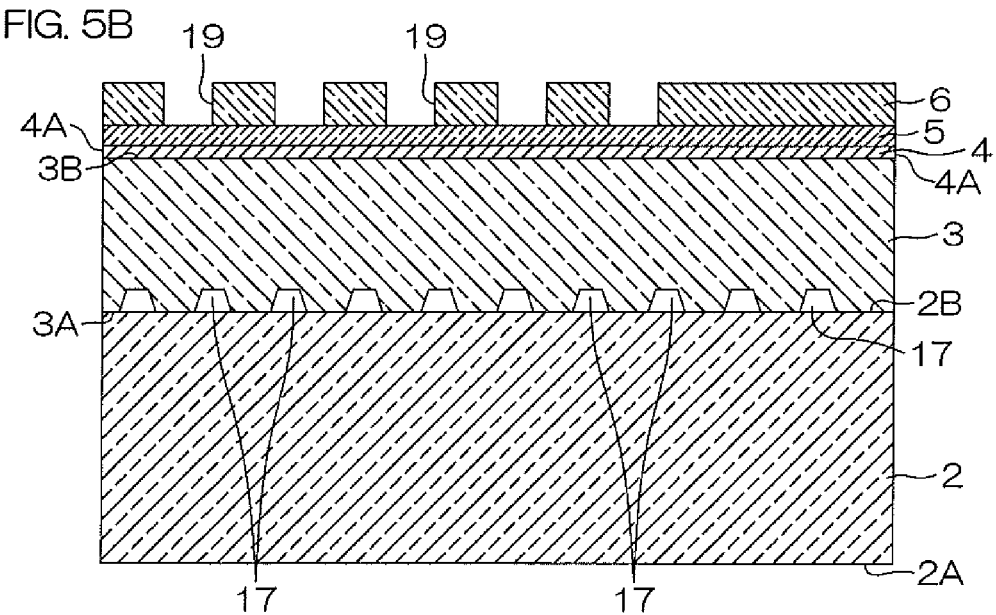
FIG. 5B is an illustrative sectional view showing a step subsequent to FIG. 5A.

Then, the transparent electrode layer 6 is pattern-formed by a lift-off method, for example, as shown in FIG. 5B. The transparent electrode layer 6 is formed on positions coinciding with the respective insulating tube layers 9 (see FIGS. 1 and 2) in a pattern having through-holes 19 passing through the transparent electrode layer 6, and it follows that the second conductivity type semiconductor layer 5 is exposed from each through-hole 19.

Figure 5C:
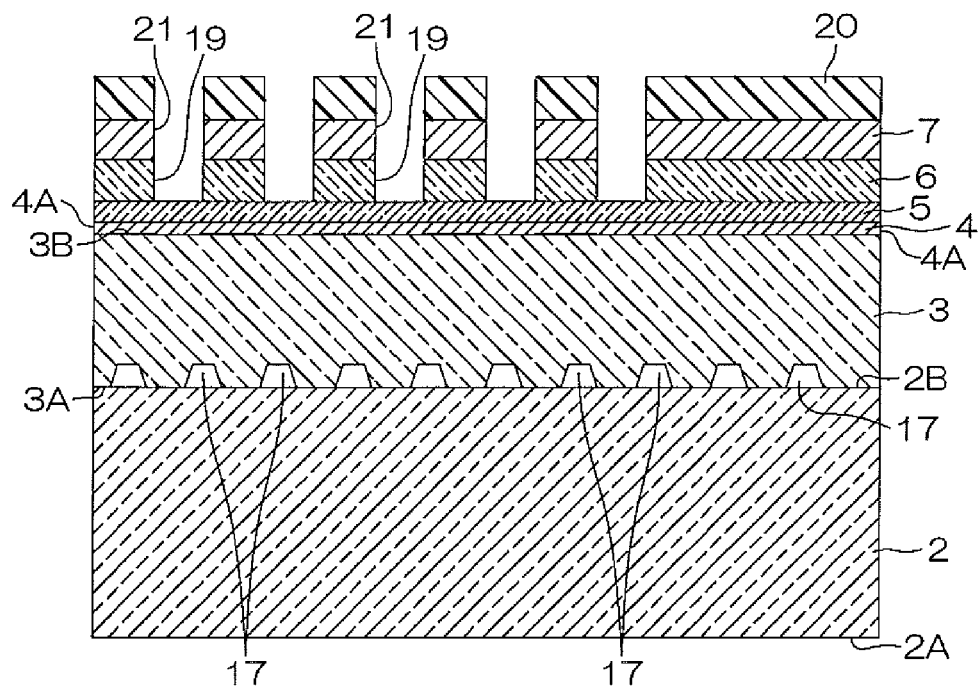
FIG. 5C is an illustrative sectional view showing a step subsequent to FIG. 5B.

Then, a layer (an alloy layer) of an alloy containing silver, a platinum group metal and copper is formed on the transparent electrode layer 6 and the whole area of the portion of the second conductivity type semiconductor layer 5 exposed from each through-hole 19, and dry etching employing a resist pattern 20 of the same pattern as the transparent electrode 6 as a mask is performed on the alloy layer, as shown in FIG. 5C. Thus, the alloy layer is selectively removed, while the remaining alloy layer turns into the reflecting electrode layer 7, and is formed on the transparent electrode layer 6 in the same pattern as the transparent electrode layer 6. Through-holes 21 identical in size to the through-holes 19 are formed in the reflecting electrode layer 7 on positions coinciding with the respective through-holes 19 of the transparent electrode layer 6 in plan view.

Figure 5D:
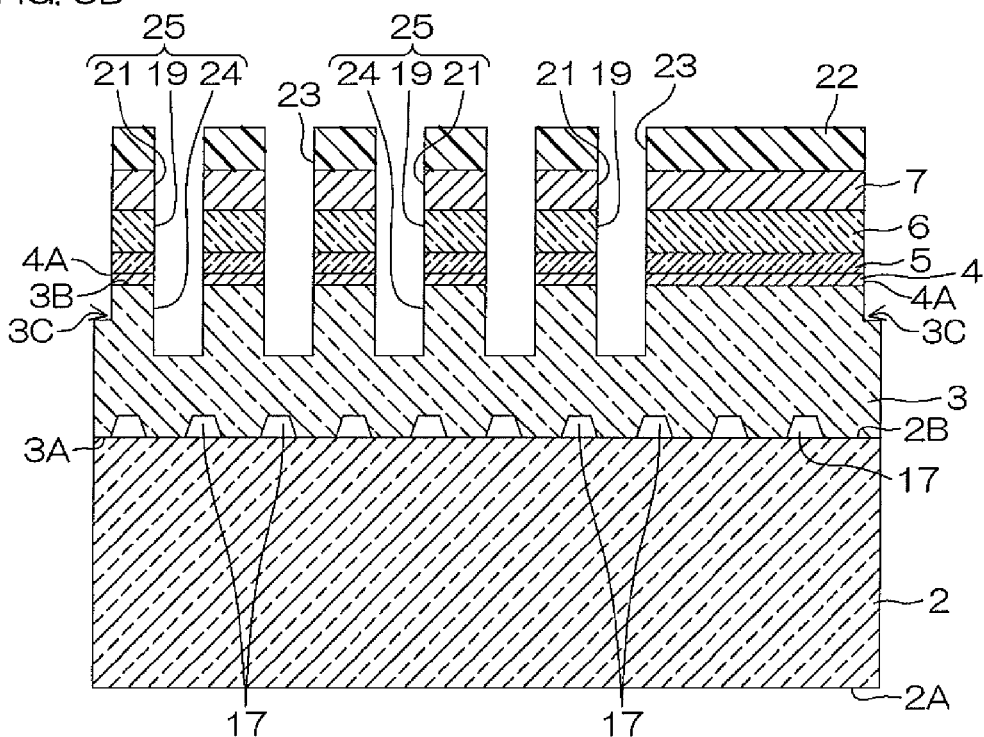
FIG. 5D is an illustrative sectional view showing a step subsequent to FIG. 5C.

Then, another resist pattern 22 is formed on the reflecting electrode layer 7 after removing the resist pattern 20, as shown in FIG. 5D. Openings 23 identical in size to the through-holes 21 are formed in the resist pattern 22 on positions coinciding with the respective through-holes 21 of the reflecting electrode layer 7 in plan view. The openings 23 are continuous with the through-holes 19 and 21 present on the same positions in plan view. The resist pattern 22 is not present on portions where the stepped portions 3C of the first conductivity type semiconductor layer 3 are expected to be positioned in plan view.

Then, the respective ones of the reflecting electrode layer 7, the transparent electrode layer 6, the second conductivity type semiconductor layer 5, the light-emitting layer 4 and the first conductivity type semiconductor layer 3 are selectively removed by dry etching employing the resist pattern 22 as a mask. Thus, trenches 24 (cylindrical trenches according to the embodiment) passing through the second conductivity type semiconductor layer 5 and the light-emitting layer 4 to reach intermediate portions of the thickness of the first conductivity type semiconductor layer 3 are formed on positions coinciding with the respective openings 23 of the resist pattern 22 in plan view, and the stepped portions 3C are formed on the first conductivity type semiconductor layer 3. Each trench 24 is continuous with the opening 23 and the through-holes 19 and 21 present on the same position in plan view. The through-holes 19 and 21 and the trench 24 continuous with one another on the same position in plan view constitute one trench 25. Such trenches 25 are formed on a plurality of (in this case, 15) dispersed positions coinciding with the insulating tube layers 9 in plan view. The respective trenches 25 are in the form of cylinders linearly extending in the thickness direction of the substrate 2 according to the embodiment, and circular shapes of sections thereof are identical in size to one another on any position in the thickness direction of the substrate 2. The respective trenches 25 pass through the reflecting electrode layer 7, the transparent electrode layer 6, the second conductivity type semiconductor layer 5 and the light-emitting layer 4, and reach intermediate portions of the thickness of the first conductivity type semiconductor layer 3. The depth (the dimension in the thickness direction of the substrate 2) of the trenches 25 from the semiconductor layer surface (the front surface of the second conductivity type semiconductor layer 5) is about 1.5 µm, for example. Portions (see FIG. 5C) of the respective ones of the reflecting electrode layer 7, the transparent electrode layer 6, the second conductivity type semiconductor layer 5 and the light-emitting layer 4 coinciding with the stepped portions 3C in plan view have been removed at the same time with the formation of the trenches 25 by the dry etching.

Figure 5E:
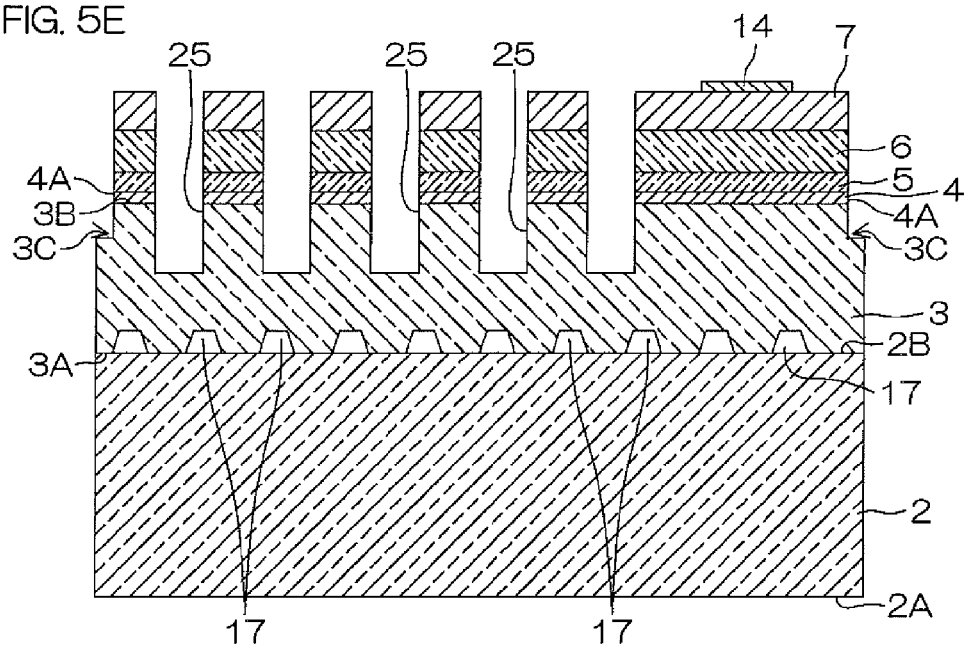
FIG. 5E is an illustrative sectional view showing a step subsequent to FIG. 5D.

Then, the etching stopper layer 14 is formed on positions of the reflecting electrode layer 7 expected to coincide with the second contacts 13 (see FIG. 2) in plan view by the lift-off method, for example, after removing the resist pattern 22, as shown in FIG. 5E.

Figure 5F:
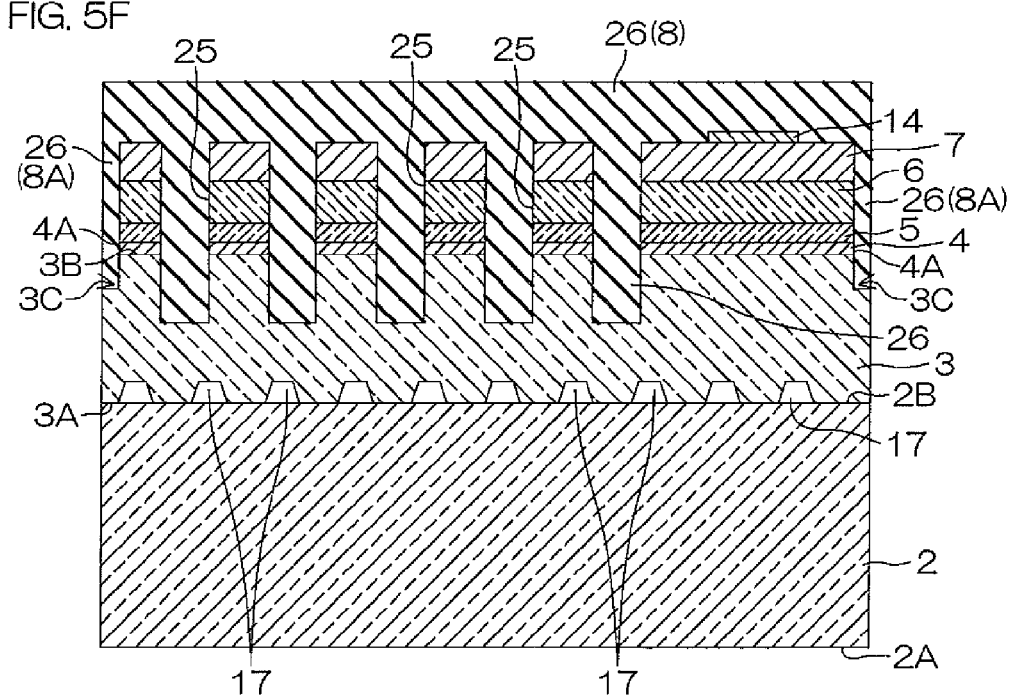
FIG. 5F is an illustrative sectional view showing a step subsequent to FIG. 5E.

Then, a layer (an SiN layer) 26 made of SiN is formed on the reflecting electrode layer 7 and the etching stopper layer 14 by CVD, for example, as shown in FIG. 5F. The SiN layer 26 is formed to fill up the respective trenches 25 and to cover the outer end surfaces of the respective ones of the light-emitting layer 4, the second conductivity type semiconductor layer 5, the transparent electrode layer 6 and the reflecting electrode layer 7 in plan view and the stepped portions 3C of the first conductivity type semiconductor layer 3 over the whole areas. In the SiN layer 26, the portion present on the reflecting electrode layer 7 and the etching stopper layer 14 turns into the insulating layer 8, and the portions covering the outer end surfaces of the respective ones of the light-emitting layer 4, the second conductivity type semiconductor layer 5, the transparent electrode layer 6 and the reflecting electrode layer 7 in plan view and the stepped portions 3C of the first conductivity type semiconductor layer 3 turn into the extensional portions 8A. It follows that the portions of the SiN layer 26 embedded in the trenches 25 form the insulating tube layers 9.

Figure 5G:
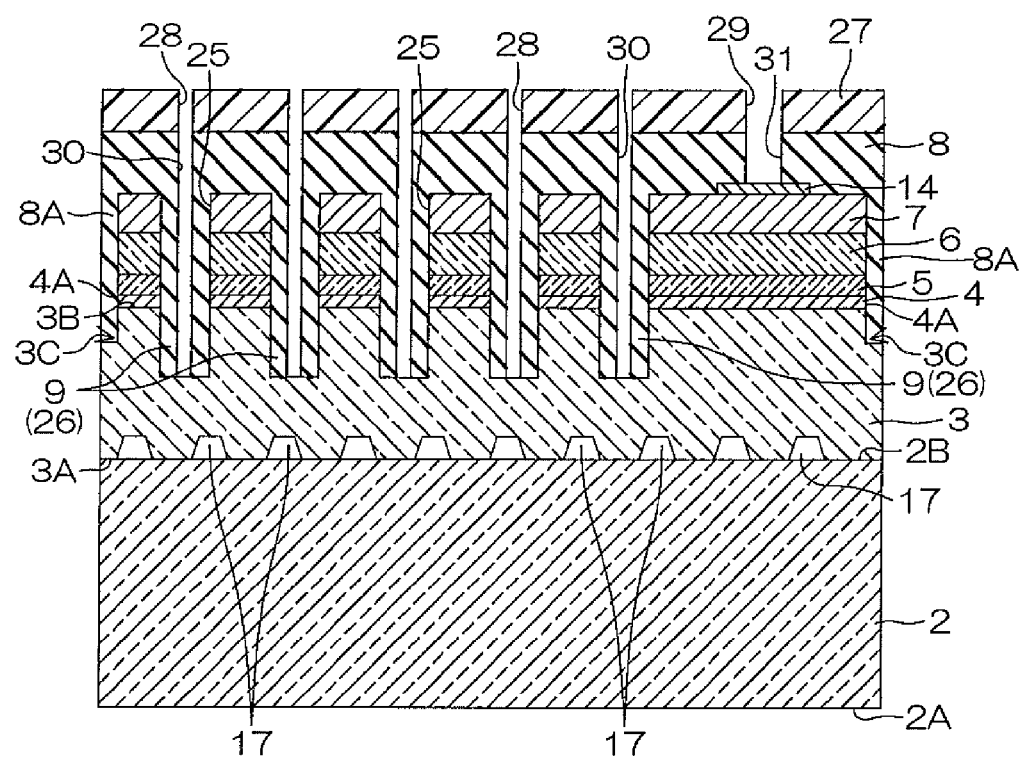
FIG. 5G is an illustrative sectional view showing a step subsequent to FIG. 5F.

Then, a resist pattern 27 is formed on the insulating layer 8, as shown in FIG. 5G. In the resist pattern 27, openings 28 are formed on positions expected to coincide with the respective first contacts 11 (see FIG. 2) in plan view, and openings 29 are formed on positions expected to coincide with the respective second contacts 13 (see FIG. 2) in plan view.

Then, the insulating layer 8 and the SiN layer 26 in the respective trenches 25 are selectively removed by dry etching employing the resist pattern 27 as a mask. Thus, the insulating layer 8 and the SiN layer 26 on positions coinciding with the respective openings 28 of the resist pattern 27 in plan view are removed from the side of the resist pattern 27. The dry etching is so conditioned that the first conductivity type semiconductor layer 3 is not etched. Therefore, the etching in the respective openings 28 stops in front of the first conductivity type semiconductor layer 3 on bottom surfaces of the trenches 25. Thus, trenches 30 passing through the insulating layer 8 and the SiN layer 26 and reaching the first conductivity type semiconductor layer 3 are formed on positions coinciding with the respective openings 28 of the resist pattern 22 in plan view.

The trenches 30 are in the form of cylinders extending in the thickness direction of the substrate 2, and circular shapes of sections thereof are identical in size to one another over the whole area of the substrate 2 in the thickness direction. The trenches 30 are formed in the same number (15 in this case) as the first contacts 11, and each trench 30 is arranged inside any trench 25. Each trench 25 reaches an intermediate portion of the thickness of the first conductivity type semiconductor layer 3, whereby each trench 30 also reaches the intermediate portion of the thickness of the first conductivity type semiconductor layer 3. The first conductivity type semiconductor layer 3 is exposed on the bottom of each trench 30. The trenches 30 are so formed that the SiN layer 26 filling up the respective trenches 25 turns into the insulating tube layers 9.

The insulating layer 8 on a position coinciding with each opening 29 of the resist pattern 27 in plan view is removed from the side of the resist pattern 27 due to the dry etching at this stage. The etching in each opening 29 stops on the etching stopper layer 14. In other words, the etching stopper layer 14 protects the reflecting electrode layer 7 present immediately under the same from the dry etching, whereby the reflecting electrode layer 7 can be prevented from being etched. Consequently, trenches 31 passing through the insulating layer 8 and reaching the etching stopper layer 14 are formed on positions coinciding with the respective openings 29 of the resist pattern 27 in plan view. The trenches 31 are formed in the same number (three in this case) as the second contacts 13, and the trenches 31 line up at regular intervals in the short-side direction (the direction orthogonal to the plane of FIG. 5G) of the substrate 2 in plan view.

Then, a layer (an Al layer 32) made of Al is formed on the whole area of the insulating layer 8 by vapor deposition, for example, after removing the resist pattern 27, as shown in FIG. 5H. The Al layer 32 fills up the respective trenches 30 and the respective trenches 31. The Al layer 32 in the trenches 30 turns into the first contacts 11, and the Al layer 32 in the trenches 31 turns into the second contacts 13.

Then, layers (Ti layers) made of Ti and layers (Pt layers) made of Pt are stacked on the whole area of the Al layer 32 present on the insulating layer 8 in this order by sputtering, for example. Thus, the barrier layers 15 consisting of multilayer structures of the Ti layers and the Pt layers are formed on the Al layer 32.

Then, layers (AuSn layers) made of AuSn are formed on the whole areas of the barrier layers 15 by electroplating, for example. The AuSn layers are the bonding layers 16.

Then, each of the Al layer 32, the barrier layers 15 and the bonding layers 16 on the insulating layer 8 is divided into two between each second contact 13 and the first contact 11 closest to the second contact 13 in the longitudinal direction of the substrate 2 in plan view (see FIG. 5H). Thus, a portion of the Al layer 32 on the insulating layer 8 covering all first contacts 11 in plan view turns into the first electrode layer 10, and a portion covering all second contacts 13 in plan view turns into the second electrode layer 12, as shown in FIG. 2. Consequently, the light-emitting element 1 is completed. The first electrode layer 10 and the second electrode layer 12 are formed on the insulating layer 8 in an isolated state.

A large number of light-emitting elements 1 are simultaneously formed on one wafer (not shown) as an original substrate, for example. When dicing the wafer after grinding/polishing the wafer and adjusting the thickness as necessary, therefore, the light-emitting element 1 of the structure shown in FIGS. 1 to 4 is finally individually cut.

The trenches 30 in which the first contacts 11 are embedded have circular sections identical in size to the first contacts 11, and the diameter (the inner diameter) thereof is not less than 20 µm and not more than 40 µm. On the other hand, the trenches 31 in which the second contacts 13 are embedded are larger than the trenches 30 in plan view (see FIG. 1). When filling up the respective trenches 31 with the Al layer 32 at the time of forming the Al layer 32 on the insulating layer 8 (see FIG. 5H) as hereinabove described, therefore, traces 90 of the respective trenches 31 appear on the insulating layer 8 as recesses, and finally appear also on the bonding surface 16A of the bonding layer 16 present on the second electrode 12 (see FIG. 4). However, the plurality of trenches 31 are at intervals in the short-side direction of the substrate 2 (see FIG. 1), whereby the traces 90 of the respective trenches 31 are remarkably small and inconspicuous as compared with a case where the trenches 31 link with one another in a line. Therefore, the bonding surface 16A of the bonding layer 16 present on the second electrode 12 is almost planarized.

Figure 6:
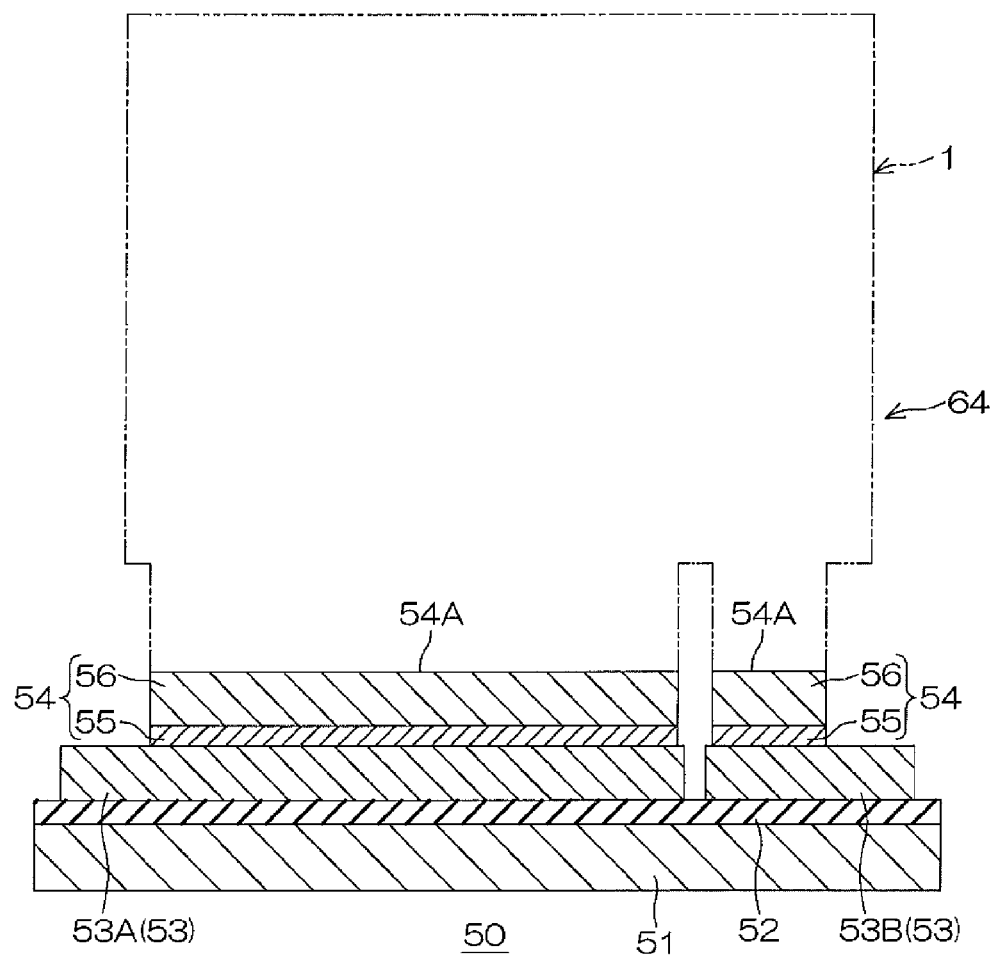
FIG. 6 is a sectional view illustratively showing the structure of a submount.

FIG. 6 is a sectional view illustratively showing the structure of a submount.

As shown with two-dot chain lines in FIG. 6, the light-emitting element 1 is bonded to a submount 50 by the bonding layers 16, to constitute a light-emitting element unit 64.

The submount 50 includes a base substrate 51, an insulating layer 52, electrode layers 53, and bonding layers 54.

The base substrate 51 is made of Si, for example. The insulating layer 52 is made of $SiO_2$, for example, and covers the whole area of the front surface (the upper surface in FIG. 6) of the base substrate 51.

The electrode layers 53 are made of Al, for example. The electrode layers 53 are provided on two regions of the insulating layer 52 separated from each other, and two electrode layers 53 are formed on the insulating layer 52 in a horizontally separated state in FIG. 6. It is assumed that the left electrode layer 53 in FIG. 6 is referred to as a first mount electrode layer 53A and the right electrode layer 53 in FIG. 6 is referred to as a second mount electrode layer 53B in the two electrode layers 53. The first mount electrode layer 53A and the second mount electrode layer 53B are arranged to be isolated from each other at an interval generally equal to the interval between the first electrode 11 and the second electrode 12, such as an interval of about 60 µm, for example.

The bonding layers 54 are stacked on the respective electrode layers 53. According to the embodiment, the bonding layers 54 have two-layer structures including Ti layers 55 on the side of the base substrate 51 and Au layers 56 stacked on the Ti layers 55. Surfaces (the upper surfaces in FIG. 6) of the bonding layers 54 opposite to surfaces in contact with the electrode layers 53 are regarded as front surfaces 54A. The front surfaces 54A are planar surfaces, and the front surfaces 54A of the bonding layers 54 on the respective electrode layers 53 are flush with each other.

Figure 7:
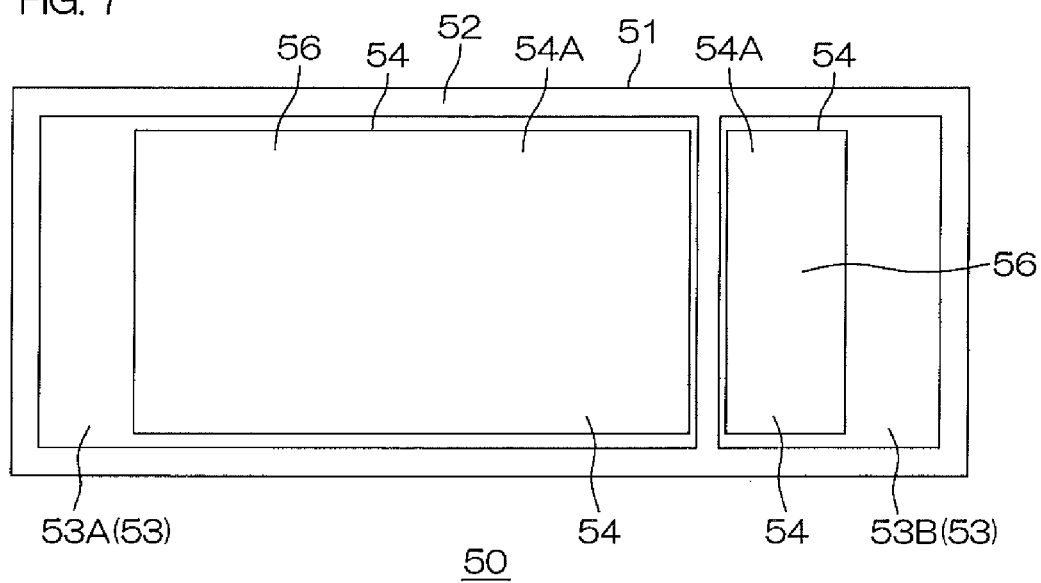
FIG. 7 is a schematic plan view of the submount.

FIG. 7 is a schematic plan view of the submount.

In plan view, the bonding layer 54 on the first mount electrode layer 53A is identical in size to the bonding layer 16 on the first electrode layer 10 of the light-emitting element 1, and the bonding layer 54 on the second mount electrode layer 53B is identical in size to the bonding layer 16 on the second electrode layer 12 of the light-emitting element 1 (see FIG. 1).

Figure 8A:
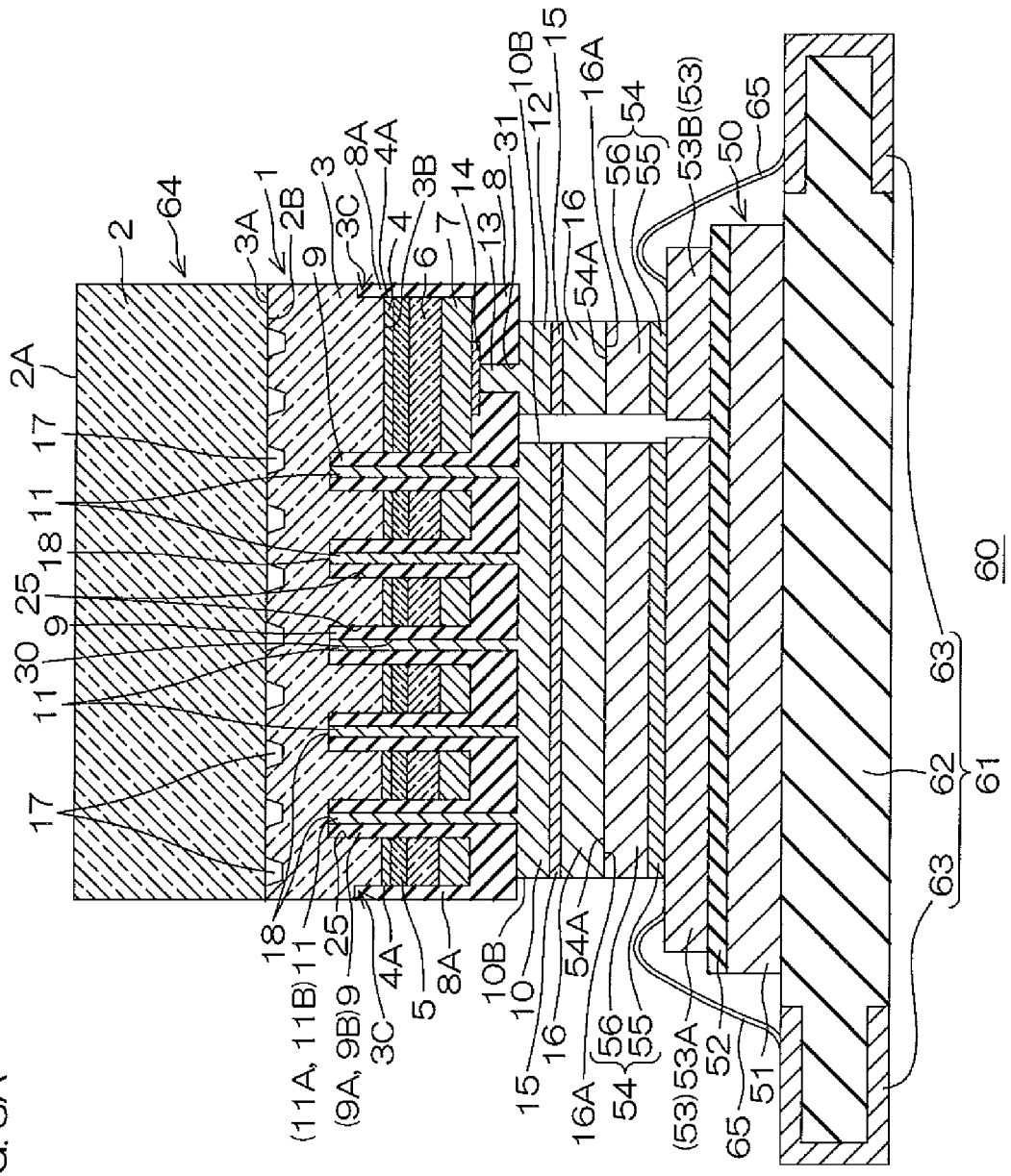
FIG. 8A is a sectional view illustratively showing the structure of a light-emitting device.

FIG. 8A is a sectional view illustratively showing the structure of a light-emitting device.

Referring to FIG. 8A, a light-emitting device 60 includes the light-emitting element 1, the submount 50, and a support substrate 61.

The support substrate 61 has an insulating substrate 62 made of an insulating material and a pair of leads 63, made of a metal, provided to be exposed from both ends of the insulating substrate 62 for electrically connecting the light-emitting element 1 and an external portion with each other. The insulating substrate 62 is provided in the form of a rectangle in plan view, for example, and the pair of leads 63 are zonally formed along a pair of opposite sides thereof respectively. The respective leads 63 are folded along a pair of end edges of the insulating substrate 62 to reach the lower surface from the upper surface through side surfaces, and formed to have lateral U-shaped sections.

In assembling, the submount 50 is brought into such a posture that the front surfaces 54A of the bonding layers 54 are upwardly directed as shown in FIG. 8A, for example. Further, the light-emitting element 1 shown in FIG. 2 is brought into such a posture (a posture vertically inverted from that of FIG. 2) that the bonding surfaces 16A of the bonding layers 16 are downwardly directed, and opposed to the submount 50 in the posture shown in FIG. 8A from above.

When the light-emitting element 1 is made to approach the submount 50, the bonding surfaces 16A of the bonding layers 16 of the light-emitting element 1 and the front surfaces 54A of the bonding layers 54 of the submount 50 come into surface contact with one another, as shown in FIG. 8A. More specifically, the bonding surface 16A of the bonding layer 16 on the side of the first electrode layer 10 comes into surface contact with the front surface 54A of the bonding layer 54 on the side of the first mount electrode layer 53A, and the bonding surface 16A of the bonding layer 16 on the side of the second electrode layer 12 comes into surface contact with the front surface 54A of the bonding layer 54 on the side of the second mount electrode layer 53B. When performing reflowing (heat treatment) in this state, the first electrode layer 10 and the first mount electrode layer 53A are bonded to each other through the bonding layers 16 and 54 while the second electrode layer 12 and the second mount electrode layer 53B are bonded to each other through the bonding layers 16 and 54, and the light-emitting element 1 is flip-chip-connected to the submount 50. In other words, the bonding layers 16 and the bonding layers 54 are melted/fixed and bonded to one another. Consequently, the light-emitting element unit 64 in which the light-emitting element 1 and the submount 50 are integrated with each other is obtained.

As hereinabove described, the traces 90 of the respective trenches 31 are present on the bonding surface 16A of the bonding layer 16 provided on the second electrode 12 while the same are extremely small, whereby the bonding surface 16A is almost planar (see FIG. 4). Therefore, the traces 90 of the respective trenches 31 do not exert any influence on the surface contact between the bonding surface 16A and the front surface 54A of the bonding layer 54 on the side of the second mount electrode layer 53B, and the bonding surface 16A and the front surface 54A are in surface contact with each other generally over the whole areas. Further, the first electrode layer 10 and the second electrode layer 12 on the side of the light-emitting element 1 separate from each other at the sufficient distance of about 60 µm, and the first mount electrode layer 53A and the second mount electrode layer 53B on the side of the submount 50 similarly separate from each other at a sufficient distance. Even if a small number of mounting errors are present, therefore, neither the first electrode layer 10 is connected to the second mount electrode layer 53B nor the second electrode layer 12 is connected to the first mount electrode layer 53A, whereby the light-emitting element 1 can be reliably flip-chip-connected to the submount 50.

The light-emitting element unit 64 is bonded to the insulating substrate 62 while opposing the base substrate 51 of the submount 50 to one surface of the insulating substrate 62. Then, the first mount electrode layer 53A connected to the first electrode layer 10 and the lead 63 on the side of the first mount electrode layer 53A are connected with each other by a bonding wire 65. Further, the second mount electrode layer 53B connected to the second electrode layer 12 and the lead 63 on the side of the second mount electrode layer 53B are connected with each other by a bonding wire 65. Thus, the light-emitting unit 64 and the support substrate 61 are integrated with each other to complete the light-emitting device 60.

As an illustrative perspective view is shown in FIG. 8B, the support substrate 61 may be elongationally (zonally) formed, and a plurality of light-emitting element units 64 may be mounted on a surface of such an elongational support substrate 61 to constitute an LED (light-emitting diode) bar. A light-emitting device 60 in which a plurality of light-emitting element units 64 are linearly arrayed in a line on one surface of the support substrate 61 is shown in FIG. 8B. Such a light-emitting device 60 can be employed as a light source for a backlight of a liquid crystal display, for example. The plurality of light-emitting element units 64 on the support substrate 61 may not necessarily be linearly arrayed in a line, but may be arrayed in two lines, or may be arrayed in a staggered manner. Further, sealing resin containing a fluorescent material may be potted onto each light-emitting element unit 64.

FIG. 9 is a schematic perspective view of a light-emitting element package employing the light-emitting element unit 64.

A light-emitting element package 70 includes the light-emitting device 60 of the structure shown in FIG. 8A, a resin package 71 and sealing resin 72.

The resin package 71 is a ring-shaped case filled with resin, and fixed to the support substrate 61 in a state storing (covering) the light-emitting element unit 64 on the inner side thereof while surrounding and protecting the same from side portions. Inner wall surfaces of the resin package 71 form reflecting surfaces 71a for reflecting light emitted from the light-emitting element 1 of the light-emitting element unit 64 and extracting the same outward. According to the embodiment, the reflecting surfaces 71a consist of inclining surfaces inclining to approach the support substrate 61 inward, and are formed to reflect the light from the light-emitting element 1 toward a light extraction direction (the normal direction of the substrate 2).

The sealing resin 72 is made of transparent resin (silicone or epoxy, for example) transparent with respect to the emission wavelength of the light-emitting element 1, and seals the light-emitting element 1 and the bonding wires 65 etc. Alternatively, a fluorescent material may be mixed into the transparent resin. When the light-emitting device 60 emits blue light and a material emitting yellow light is arranged as the fluorescent material, spontaneous emission is obtained.

While the structure in which one light-emitting element unit 64 is mounted on the support substrate 61 is shown in FIG. 9, a plurality of light-emitting element units 64 may be mounted in common on the support substrate 61, and the same may be sealed in common by the sealing resin 72, as a matter of course.

Figure 10:
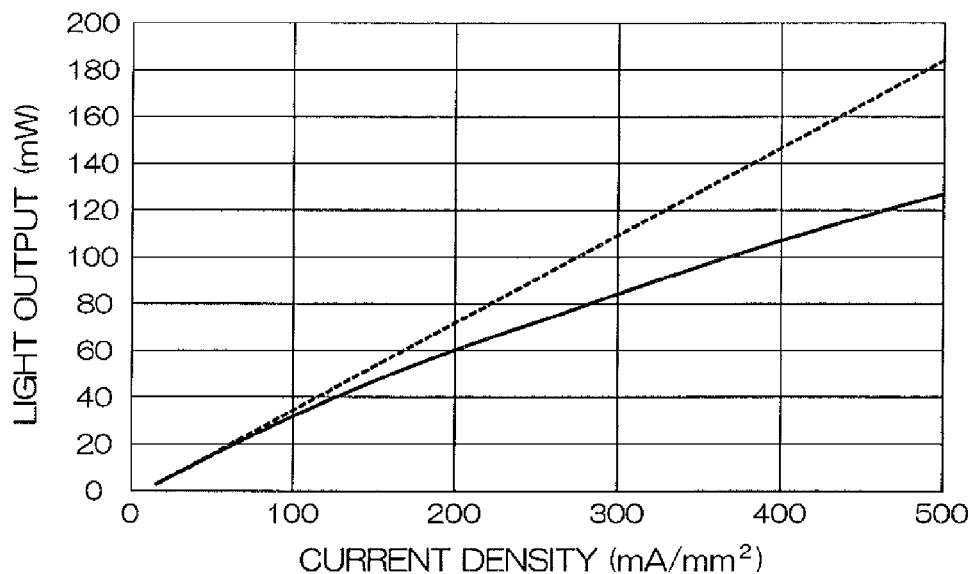
FIG. 10 is a graph showing the relation between current density and light output.

FIG. 10 is a graph showing the relation between current density and light output in a light-emitting diode.

Referring to FIG. 10, it is theoretically expected in the light-emitting diode that the light output linearly increases when the current density ascends (a theoretic line of a broken line in FIG. 10). In practice, however, the so-called droop phenomenon takes place to cause loss in the light output when the current density ascends, and hence the light output is along a characteristic line (a solid line in FIG. 10) deviating downward (a descending side) from the theoretic line.

The loss of the light output must be reduced in order to improve luminous efficiency by setting current applied to the light-emitting element 1 constant, and hence the current density must be relaxed (lowered) for that purpose. While it is effective to enlarge the light-emitting layer 4 in plan view shown in FIG. 1 in order to relax the current density, cost increase cannot be avoided if the substrate 2 (the whole chip) is enlarged for that purpose. Therefore, the ratio (referred to as an actual emission area ratio) occupied by the light-emitting layer 4 in the substrate 2 is desirably enlarged by enlarging the light-emitting layer 4 in plan view without changing the size (the chip size) of the substrate 2, and the light-emitting element 1 according to the embodiment of the present invention has the aforementioned structure for that purpose.

In other words, the first electrode layer 10 and the first conductivity type semiconductor layer 3 are separately arranged by holding the light-emitting layer 4, the second conductivity type semiconductor layer 5, the transparent electrode layer 6, the reflecting electrode layer 7 and the insulating layer 8 therebetween in the light-emitting element 1, as shown in FIG. 2. Further, the first electrode layer 10 is connected to the first conductivity type semiconductor layer 3 through the plurality of first contacts 11 discretely arranged in plan view. Therefore, current can be smoothly fed between the first electrode layer 10 and the first conductivity type semiconductor layer 3 to an extent similar to that in a case where the first electrode layer 10 is directly stacked on the first conductivity type semiconductor layer 3.

As compared with the area of a contact portion between the first electrode layer 10 and the first conductivity type semiconductor layer 3 in the case where the first electrode layer 10 is directly stacked on the first conductivity type semiconductor layer 3, the total area of the contact portions 18 between the plurality of discretely arranged first contacts 11 and the first conductivity type semiconductor layer 3 can be suppressed small. This is because the first contacts 11 are so discretely arranged that the current can be sufficiently dispersed to the whole of the first conductivity type semiconductor layer 3. Thus, the light-emitting layer 4 can be inhibited from being corroded by the structure for connecting the first electrode layer 10 and the first conductivity type semiconductor layer 3 with each other. Therefore, the area of the light-emitting layer 4 on the first conductivity type semiconductor layer 3 can be enlarged in the light-emitting element 1, whereby the current density can be suppressed, and improvement of the luminous efficiency can be attained in response thereto.

Figure 11:
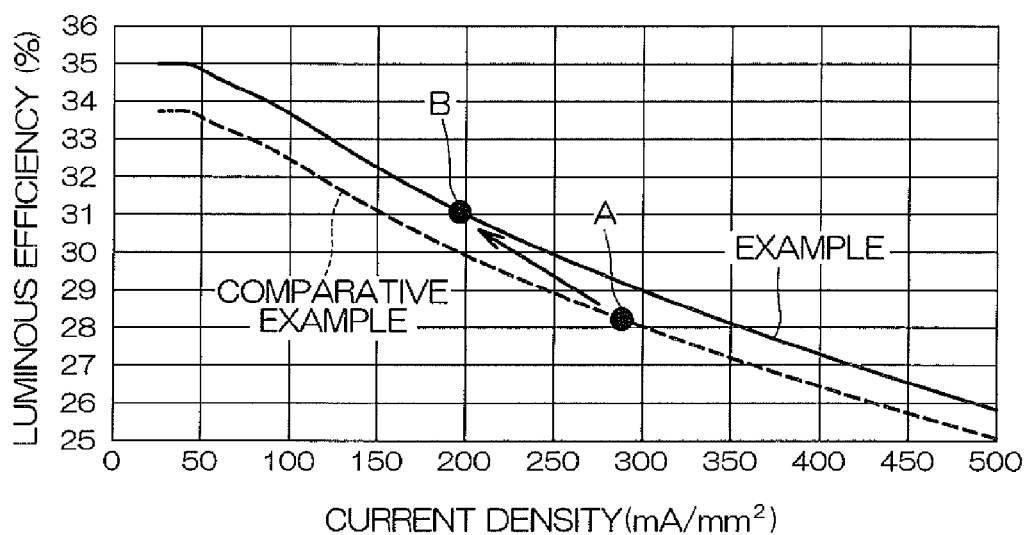
FIG. 11 is a graph showing the relation between the current density and luminous efficiency.

As hereinabove described, the inventors have studied the structure (comparative example) of the exposed n-type semiconductor layer having the end region and the plurality of branch portions extending from the end region and the n electrode (having a plurality of branch portions similarly to the n-type semiconductor layer) arranged thereon by developing the structure described in Patent Document 1. FIG. 11 shows the relation between current density and luminous efficiency in the comparative example with a broken line. In other words, a light-emitting layer is remarkably corroded due to the arrangement of the branch portions of the n electrode in the structure of comparative example, and hence the area of the light-emitting layer diminishes, and the luminous efficiency deteriorates as a result.

Therefore, the inventors have further advanced the study to come to the structure of the light-emitting element 1 according to the embodiment having the plurality of first contacts 11, and succeeded in uniformly brightening the whole of the light-emitting layer 4 while enlarging the area of the light-emitting layer 4 by applying the structure. FIG. 11 shows a result of investigating the relation between current density and luminous efficiency as to Example corresponding to the structure of the embodiment with a solid line. From comparison of the two curves in FIG. 11, it is understood that the luminous efficiency is improved in the whole region of the current density. Further, the first electrode layer 10 is not directly stacked on the first conductivity type semiconductor layer 3 but stacked on the insulating layer 8, whereby it has been possible to enlarge the first electrode layer 10 without being influenced by the light-emitting layer 4 on the first conductivity type semiconductor layer 3.

According to the structure of the embodiment, the plurality of first contacts 11 are uniformly dispersively arranged in plan view (see FIG. 1). Therefore, portions (the contact portions 18) for introducing current into the first electrode layer 10 are uniformly distributed over a wide range on the first conductivity type semiconductor layer 3, whereby the current uniformly spreads over a wide range in the light-emitting layer 4. Thus, the number of lucent portions in the light-emitting layer 4 can be further increased, whereby further improvement of the luminous efficiency of the light-emitting element 1 can be attained. Further, the current can be smoothly fed from the first conductivity type semiconductor layer 3 toward the side of the first electrode layer 10 through the introducing portions uniformly distributed over the wide range.

Referring to FIG. 1, the plurality of first contacts 11 are so arranged that the interval (the aforementioned intervals C and D) between one first contact 11 and another first contact 11 closest to the first contact 11 is constant, in order to uniformly dispersively arrange the plurality of first contacts 11 in plan view.

The plurality of first contacts 11 include the first edge-side contacts 11A arranged along the edges (the longitudinal edges 10A and the short-side edges 10B) of the first electrode layer 10 in plan view, whereby the introducing portions (the contact portions 18 in FIG. 2) are arranged at least on the edge sides in the first conductivity type semiconductor layer 3, in response to the first edge-side contacts 11A. Thus, the current can be spread up to the edge sides in the light-emitting layer 4 on the first conductivity type semiconductor layer 3. Therefore, the number of lucent portions in the light-emitting layer 4 can be increased, whereby improvement of the luminous efficiency of the light-emitting element 1 can be attained.

The plurality of first contacts 11 include the second edge-side contacts 11B arranged along the edge (the left short-side edge 10B in FIG. 1) of the first electrode layer 10 opposite to the side of the second electrode layer 12 in plan view, whereby the introducing portions are arranged at least on the side of the edge opposite to the side of the second electrode layer 12 in the first conductivity type semiconductor layer 3, in response to the second edge-side contacts 11B. Thus, the current can be spread up to the edge side opposite to the side of the second electrode layer 12 in the light-emitting layer 4 on the first conductivity type semiconductor layer 3. Therefore, the number of lucent portions in the light-emitting layer 4 can be increased, whereby improvement of the luminous efficiency of the light-emitting element 1 can be attained.

The contact portions 18 of the first contacts 11 with respect to the first conductivity type semiconductor layer 3 are in the form of circles, whereby the current can be incorporated over the whole peripheries of the circles in the contact portions 18, i.e., the introducing portions. Thus, the current can be smoothly fed from the first conductivity type semiconductor layer 3 to the first contacts 11.

The sum (the total first contact area) of the areas of the contact portions 18 of all first contacts 11 with respect to the first conductivity type semiconductor layer 3 is not less than 3000 $\mu m^2$ and not more than 25000 $\mu m^2$.

Figure 12:
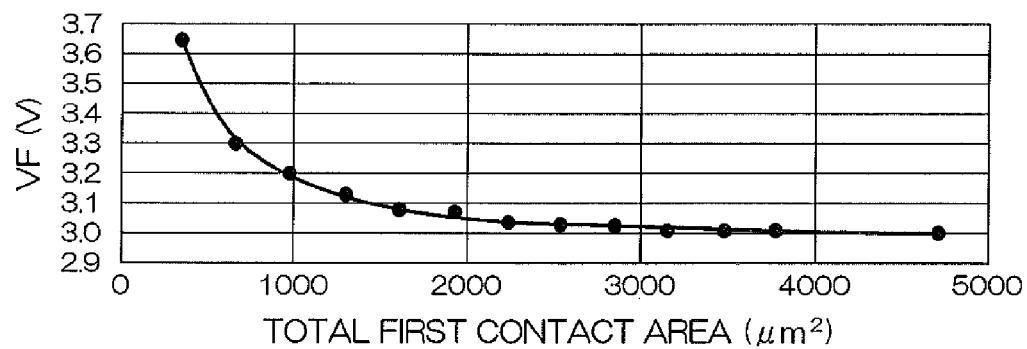
FIG. 12 is a graph showing the relation between a total first contact area and forward voltage (VF).

FIG. 12 is a graph showing the relation between the total first contact area and forward voltage (VF). As shown in FIG. 12, the forward voltage (VF) in the light-emitting element 1 lowers as the total first contact area increases, and the forward voltage becomes generally constant when the total first contact area is not less than 3000 $\mu m^2$. In other words, it is understood that the forward voltage VF tends to be saturated in the range where the total first contact area is not less than 3000 $\mu m^2$, while resistance in the contact portions 18 diminishes and the current easily flows when enlarging the total first contact area.

Figure 13:
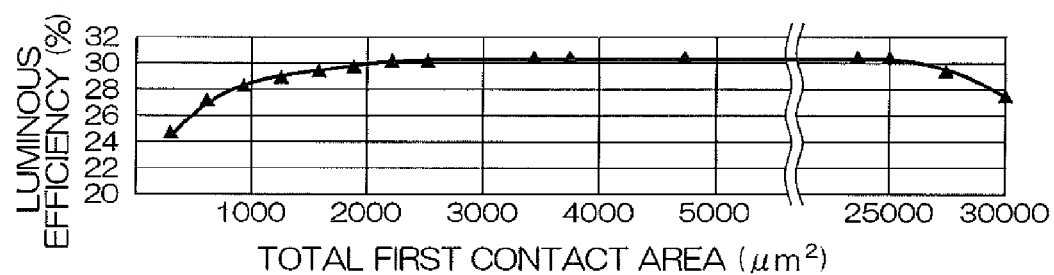
FIG. 13 is a graph showing the relation between the total first contact area and the luminous efficiency.

FIG. 13 is a graph showing the relation between the total first contact area and the luminous efficiency. As shown in FIG. 13, the luminous efficiency of the light-emitting element 1 improves as the total first contact area increases, and the luminous efficiency becomes generally constant at the maximum value when the total first contact area is not less than 3000 $\mu m^2$. When the first contact area exceeds 25000 $\mu m^2$, on the other hand, influence exerted by reduction (narrowing) of the area of the light-emitting layer 4 enlarges, and the luminous efficiency lowers.

Thus, improvement of the luminous efficiency can be attained while lowering the forward voltage VF by setting the total first contact area not less than 3000 $\mu m^2$ and not more than 25000 $\mu m^2$ in the light-emitting element 1.

Referring to FIG. 2, the first electrode layer 10 is in contact with the insulating layer 8 and has the first contacts 11, and constitutes the second reflecting electrode layer reflecting light transmitted through the insulating layer 8. Therefore, light-reflecting efficiency can be improved by reflecting light not reflected by the reflecting electrode 7 stacked on the transparent electrode layer 6 but transmitted through the insulating layer 8 on the first electrode layer 10, whereby improvement of the luminous efficiency of the light-emitting element 1 can be attained.

The insulating layer 8 covers the end surfaces 4A of the light-emitting layer 4 exposed from between the first conductivity type semiconductor layer 3 and the second conductivity type semiconductor layer 5, whereby light can be prevented from leaking out of the end surfaces 4A of the light-emitting layer 4 when the light-emitting layer 4 emits the light. Thus, improvement of the luminous efficiency of the light-emitting element 1 can be attained.

In the light-emitting element 1 according to the embodiment of the present invention, the light-emitting layer 4 is so enlarged (widened in plan view) that the aforementioned actual emission area ratio reaches about 79%, for example. In the light-emitting element according to the aforementioned comparative example prepared by improving the structure according to Patent Document 1, the actual emission area ratio is about 63%, for example. Therefore, it has been possible to improve the actual emission area ratio by about 16% with respect to comparative example. Thus, the luminous efficiency has improved by about 1% in the whole area of the current density, as shown in the solid line (Example) in FIG. 11. Current density at a time of applying about 100 mA to the light-emitting element according to the aforementioned comparative example is 300 mA/mm$^2$, for example, and luminous efficiency is about 28% (a point A in FIG. 11). In the light-emitting element 1 according to Example to which the embodiment is applied, on the other hand, current density at a time of applying the same current has been relaxed up to about 200 mA/mm$^2$, for example, and the luminous efficiency has risen up to about 31%, as shown at a point B in FIG. 11.

Figure 14:
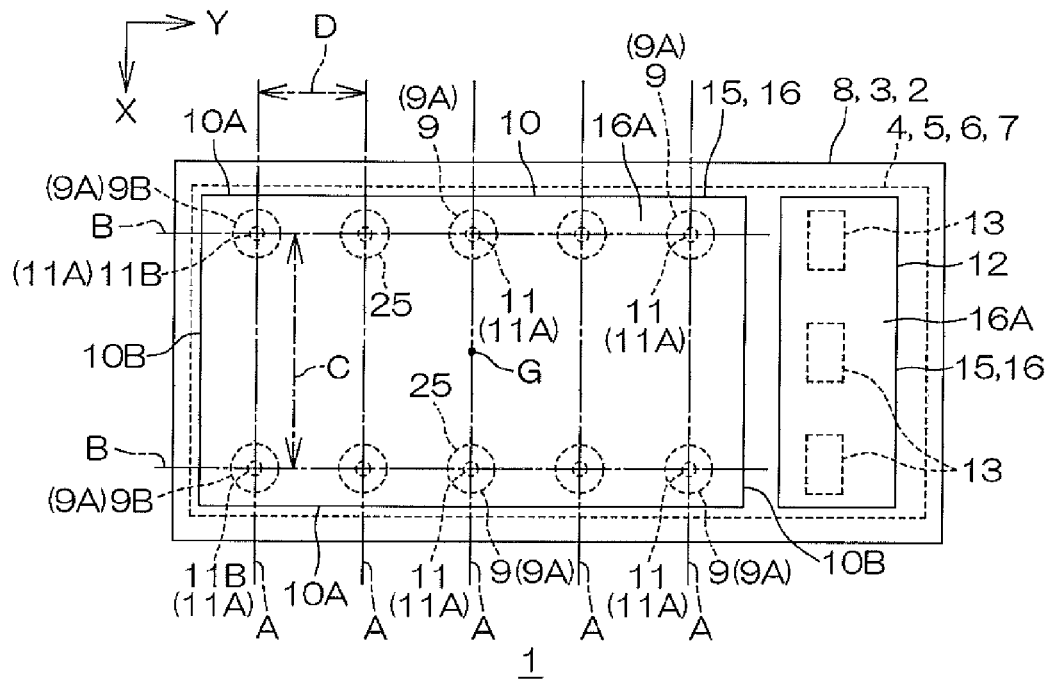
FIG. 14 is a schematic plan view of a light-emitting element according to a first modification.
Figure 15:
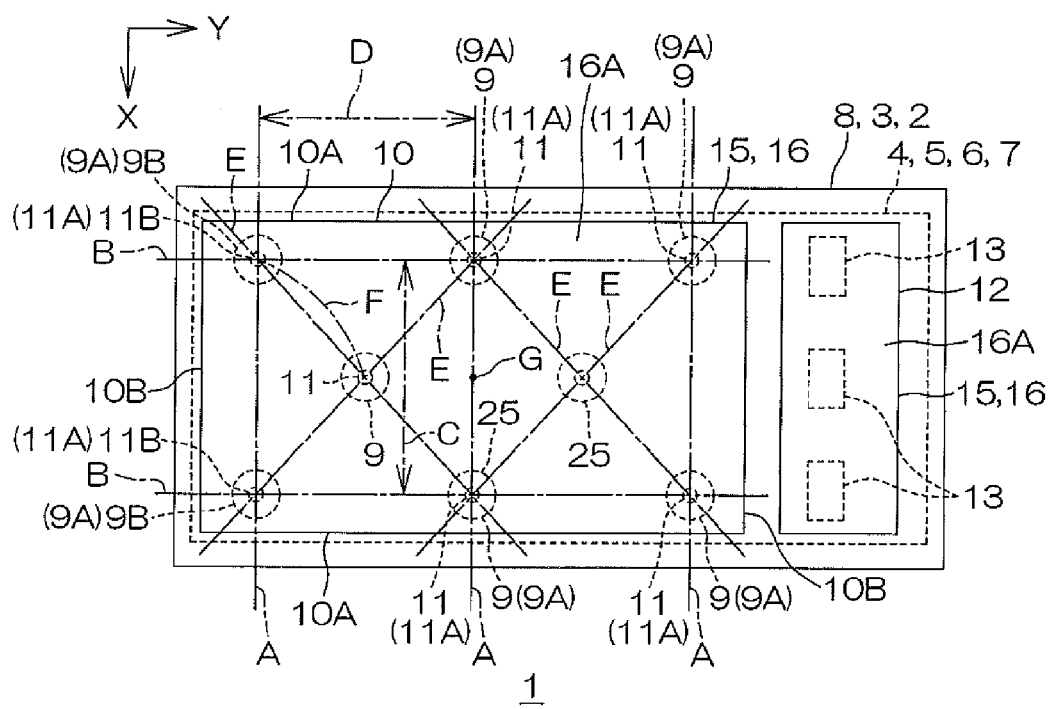
FIG. 15 is a schematic plan view of a light-emitting element according to a second modification.

FIG. 14 is a schematic plan view of a light-emitting element according to a first modification. FIG. 15 is a schematic plan view of a light-emitting element according to a second modification.

As shown in FIG. 14, first contacts 11 may include only first edge-side contacts 11A arranged along longitudinal edges 10A of a first electrode layer 10 in plan view.

As shown in FIG. 15, first contacts 11 may be arranged in a staggered manner in plan view. In this case, first edge-side contacts 11A along longitudinal edges 10A of a first electrode layer 10 are arranged in line on the aforementioned second array lines B, and remaining first contacts 11 are arranged in line on the aforementioned third array lines E.

In either case of FIGS. 14 and 15, the first contacts 11 are arranged to be point-symmetrical with respect to (the center of symmetry of) the location G of the center of gravity of the first electrode layer 10.

In addition to the above description, however, the arrangement of the first contacts 11 is properly changeable, and the first contacts 11 may not be arranged to be point-symmetrical with respect to (the center of symmetry of) the location G of the center of gravity, for example. In this case, second edge-side contacts 11B along the short-side edge 10B on the side farther from the second electrode 12 are preferably at least arranged on the first electrode layer 10, in order to widely spread current in the light-emitting layer 4.

In addition to the above, the present invention can take various embodiments. While such an example that the first contacts 11 have columnar shapes has been shown in the aforementioned embodiment, the first contacts 11 may be in the form of polygonal prisms. Further, normal-sectional shapes of the first contacts 11 may not be uniform along the axial direction, but the first contacts 11 may be so designed that sectional areas enlarge as separating from the contact portions 18, for example. While such an example that the first conductivity type is the n-type and the second conductivity type is the p-type has been described in the above embodiment, the light-emitting element may be constituted while setting the first conductivity type to the p-type and setting the second conductivity type to the n-type. In other words, a structure reversing the conductivity types between the p-type and the n-type in the aforementioned embodiment is also one embodiment of the present invention. While GaN has been illustrated as the nitride semiconductor in the aforementioned embodiment, another nitride semiconductor such as aluminum nitride (AlN) or indium nitride (InN) may be employed. A nitride semiconductor can be generally expressed as $Al_xIn_yGa_{1-x-y}N$ ($0 \leq x \leq 1$, $0 \leq y \leq 1$ and $0 \leq x+y \leq 1$). Further, the semiconductor is not restricted to the nitride semiconductor, but the present invention may be applied to a light-emitting element employing another compound semiconductor such as GaAs or the like or a semiconductor material (diamond, for example) other than the compound semiconductor.

DESCRIPTION OF THE REFERENCE NUMERALS 1 light-emitting element
2 substrate
3 first conductivity type semiconductor layer
4 light-emitting layer
4A end surface
5 second conductivity type semiconductor layer
6 transparent electrode layer
7 reflecting electrode layer
8 insulating layer
9 insulating tube layer
10 first electrode layer
10A longitudinal edge
10B short-side edge
11 first contact
11A first edge-side contact
11B second edge-side contact
12 second electrode layer
13 second contact
14 etching stopper layer
16 bonding layer
18 contact portion
50 submount
64 light-emitting element unit
70 light-emitting element package
71 resin package
C interval
D interval
F interval
G location of center of gravity

What is claimed:

1. A light-emitting element comprising:
a first conductivity type semiconductor layer;
a light-emitting layer stacked on the first conductivity type semiconductor layer;
a second conductivity type semiconductor layer stacked on the light-emitting layer;
a transparent electrode layer, stacked on the second conductivity type semiconductor layer, transparent with respect to an emission wavelength of light emitted from the light-emitting layer;
a reflecting electrode layer, stacked on the transparent electrode layer, reflecting light transmitted through the transparent electrode layer, the reflecting electrode layer being electrically connected to the light-emitting layer;
an insulating layer stacked on the reflecting electrode layer;
a first electrode layer stacked on the insulating layer; and
a second electrode layer stacked on the insulating layer in a state isolated from the first electrode layer, wherein
respective regions of the light-emitting layer, the second conductivity type semiconductor layer, the transparent electrode layer and the reflecting electrode layer coincide with one another in a plan view as viewed from a thickness direction of the first conductivity type semiconductor layer.

2. A light-emitting element comprising:
a first conductivity type semiconductor layer;
a light-emitting layer stacked on the first conductivity type semiconductor layer;
a second conductivity type semiconductor layer stacked on the light-emitting layer;
a transparent electrode layer, stacked on the second conductivity type semiconductor layer, transparent with respect to an emission wavelength of light emitted from the light-emitting layer;
a reflecting electrode layer, stacked on the transparent electrode layer, reflecting light transmitted through the transparent electrode layer;

an insulating layer stacked on the reflecting electrode layer;

a first electrode layer stacked on the insulating layer;

a second electrode layer stacked on the insulating layer in a state isolated from the first electrode layer;

a plurality of insulating tube layers, discretely arranged in a plan view as viewed from a thickness direction of the first conductivity type semiconductor layer, passing through the reflecting electrode layer, the transparent electrode layer, the second conductivity type semiconductor layer and the light-emitting layer continuously from the insulating layer and reaching the first conductivity type semiconductor layer;

first contacts, continuous from the first electrode layer, connected to the first conductivity type semiconductor layer through the insulating layer and the insulating tube layers; and second contacts, continuous from the second electrode layer, passing through the insulating layer to be connected to the reflecting electrode layer, wherein respective regions of the light-emitting layer, the second conductivity type semiconductor layer, the transparent electrode layer and the reflecting electrode layer coincide with one another in the plan view.

3. The light-emitting element according to claim 2, wherein the first contacts are uniformly dispersively arranged in the plan view.

4. The light-emitting element according to claim 3, wherein the first contacts are so arranged that intervals, each being between a respective one of the first contacts and another of the first contacts closest to the respective one of the first contacts, are constant.

5. The light-emitting element according to claim 4, wherein the intervals are each not less than 50 µm and not more than 150 µm.

6. The light-emitting element according to claim 3, wherein the first contacts are arranged in a form of a matrix.

7. The light-emitting element according to claim 2, wherein the first contacts are arranged to be point-symmetrical with respect to a location of a center of gravity of the first electrode layer in the plan view.

8. The light-emitting element according to claim 2, wherein the first contacts include a first edge-side contact arranged along an edge of the first electrode layer in the plan view.

9. The light-emitting element according to claim 8, wherein the first contacts include a second edge-side contact arranged along an edge of the first electrode layer opposite to a side of the second electrode layer in the plan view.

10. The light-emitting element according to claim 2, wherein contact portions of the first contacts with respect to the first conductivity type semiconductor layer have circular shapes.

11. The light-emitting element according to claim 10, wherein diameters of the contact portions are each not less than 20 µm and not more than 40 µm.

12. The light-emitting element according to claim 10, wherein the first contacts have columnar shapes.

13. The light-emitting element according to claim 2, wherein a sum of areas of contact portions of all the first contacts with respect to the first conductivity type semiconductor layer is not less than 3000 µm$^2$ and not more than 25000 µm$^2$.

14. The light-emitting element according to claim 2, wherein the insulating layer is made of SiN.

15. The light-emitting element according to claim 2, wherein the reflecting electrode layer is made of an alloy containing silver, a platinum group metal and copper.

16. The light-emitting element according to claim 15, wherein the platinum group metal is platinum or palladium.

17. The light-emitting element according to claim 2, wherein the transparent electrode layer is made of ITO.

18. The light-emitting element according to claim 2, wherein the first electrode layer includes:

a second reflecting electrode layer, in contact with the insulating layer and having the first contacts, reflecting light transmitted through the insulating layer.

19. The light-emitting element according to claim 18, wherein the second reflecting electrode layer is made of Al.

20. The light-emitting element according to claim 2, further comprising a substrate, transparent with respect to the emission wavelength of the light of the light-emitting layer, on which the first conductivity type semiconductor layer is stacked.

21. The light-emitting element according to claim 2, wherein the first conductivity type semiconductor layer and the second conductivity type semiconductor layer are made of nitride semiconductors.

22. The light-emitting element according to claim 2, wherein the insulating layer covers an end surface of the light-emitting layer exposed from between the first conductivity type semiconductor layer and the second conductivity type semiconductor layer.

23. The light-emitting element according to claim 2, further comprising an etching stopper layer, stacked on the reflecting electrode layer, arranged between the reflecting electrode layer and the second contacts.

24. The light-emitting element according to claim 1, further comprising bonding layers stacked on respective ones of the first electrode layer and the second electrode layer.

25. The light-emitting element according to claim 24, wherein the bonding layers are made of AuSn.

26. A light-emitting element unit comprising:

the light-emitting element according to claim 24; and a submount bonded to the bonding layers.

27. A light-emitting element package comprising:

the light-emitting element unit according to claim 26; and a resin package storing the light-emitting element unit.

* * * * *